US006919128B2

(12) United States Patent
McCreery

(10) Patent No.: US 6,919,128 B2
(45) Date of Patent: Jul. 19, 2005

(54) PIXEL ARRAY

(75) Inventor: Richard L. McCreery, Worthington, OH (US)

(73) Assignee: The Ohio State University, Columbus, OH (US)

( * ) Notice: Subject to any disclaimer, the term of this patent is extended or adjusted under 35 U.S.C. 154(b) by 0 days.

(21) Appl. No.: 10/754,257

(22) Filed: Jan. 9, 2004

(65) Prior Publication Data

US 2004/0190429 A1 Sep. 30, 2004

Related U.S. Application Data

(62) Division of application No. 09/755,437, filed on Jan. 5, 2001.

(51) Int. Cl.[7] .......................... B32B 7/04; B32B 33/00; B32B 35/00
(52) U.S. Cl. .................... 428/333; 428/338; 428/411.1; 428/420
(58) Field of Search ................................ 428/333, 338, 428/411.1, 420

(56) References Cited

U.S. PATENT DOCUMENTS

| | | | |
|---|---|---|---|
| 4,828,917 A | 5/1989 | Wegner et al. ............... 428/333 |
| 5,208,154 A | * 5/1993 | Weaver et al. ............... 435/176 |
| 5,846,909 A | 12/1998 | McDevitt et al. ........... 505/233 |
| 5,908,692 A | 6/1999 | Hamers et al. .............. 428/333 |
| 6,046,925 A | 4/2000 | Tsien et al. .................. 365/111 |
| 6,103,868 A | 8/2000 | Heath et al. ................. 528/482 |
| 6,114,099 A | * 9/2000 | Liu et al. ..................... 430/324 |
| 6,124,963 A | 9/2000 | Schumaker .................. 359/245 |
| 6,128,214 A | 10/2000 | Kuekes et al. .............. 365/151 |

FOREIGN PATENT DOCUMENTS

WO    WO 92/13983 A1 * 8/1992

OTHER PUBLICATIONS

C.A. Mirkin, M.A. Ratner, "*Molecular Electronics*", Annu. Rev. Phys. Chem., 1992, 43, 719–754.

M.A. Reed, J.M. Tour, "*Computing with Molecules*", Scientific American, 2000, 86–93.

L.A. Bumm, J.J. Arnold, M.T. Cygan, T.D. Dunbar, T.P. Burgin, L. Jones, D.L. Allara, J.M. Tour, P.S. Weiss, "*Are single Molecular Wires Conducting?*", Science, 1996, 271, 1705.

C. Zhou, M.R. Deshpande, M.A. Reed, L. Jones, J.M. Tour, "*Nanoscale Metal/Self–Assembled Monolayer/Metal Heterostructures*", Appl. Phys. Lett., 1997, 71(5), 661.

M.A. Reed, C. Zhou, C.J. Muller, T.P. Burgin, J.M. Tour, "*Conductance of a Molecular Junction*", Science, 1997, 278, 252.

L.A. Bumm, J.J. Arnold, T.D. Dunbar, D.L. Allara, P.S. Weiss, "*Electron Transfer through Organic Molecules*", J. Phys. Chem. B., 1999, 103, 8122–8127.

C.P. Collier, E.W. Wong, M. Belohradsky, F.M. Raymo, J.F. Stoddart, P.J. Kuekes, R.S. Williams, J.R. Heath, "*Electronically Configurable Molecular–Based Logic Gates*", Science, 1999, 285, 391–393.

(Continued)

Primary Examiner—Ramsey Zacharia
(74) Attorney, Agent, or Firm—Standley Law Group LLP

(57) ABSTRACT

The present invention includes a chemical monolayer construction that comprises: (a) a substrate having a contact surface; and (b) a plurality of substantially parallel molecular units, wherein said molecular units are attached to said substrate so as to be strongly coupled electronically to said substrate, such as through a conjugated bond. The present invention also includes electronic circuit components and devices including a chemical monolayer construction of the present invention.

4 Claims, 22 Drawing Sheets

OTHER PUBLICATIONS

C.P. Collier, G. Mattersteig, E.W. Wong, Y. Luo, K. Beverly, J. Sampaio, F.M. Raymo, J.F. Stoddart, J.R. Heath, "A[2] Catenane–Based Solid State Electronically Reconfigurable Switch", Science, 2000, 289, 1172–1175.

P. Allongue, M. Delamar, B. Desbat, O. Fagebaume, R. Hitmi, J. Pinson, J.M. Saveant, "Covalent Modification of Carbon Surfaces by Aryl Radicals Generated from the Electrochemical Reduction of Diazonium Salts", J. Am. Chem. Soc., 1997, 119, 201–207.

Y–C. Liu, R.L. McCreery, "Reactions of Organic Monolayers on Carbon Surfaces Observed with Unenhanced Raman Spectroscopy", J. Am. Chem. Soc., 1995, 117, 11254.

S. Ranganathan, R. McCreery, S.M. Majji, M. Madou, "Photoresist–Derived Carbon for Microelectrochemical Applications", J. Electrochem. Soc., 2000. 147, 277–282.

S.N. Yaliraki, M. Kemp, M.A. Ratner, "Conductance of Molecular Wires: Influence of Molecule–Electrode Binding", J. Am. Chem. Soc., 1999, 121, 3428–3434.

T. Rueckes, K. Kim, E. Joselevich, G.Y. Tseng, C. Cheung, C.M. Lieber, "Carbon Nanotube–based Nonvolatile Random Access Memory of Molecular Compting", Science, 2000, 289, 94–97.

J. Chen, M.A. Reed, A.M. Rawlett, J.M. Tour, "Large On–Off Ratios and Negative Differential Resistance in a Molecular Electronic Device", Science, 1999, 286, 1551–1552.

C. Kergueris, J.P. Bourgoin, S. Palacin, D. Esteve, C. Urbina, M. Magoga, C. Joachim, "Electron Transport Through a Metal–Molecule–Metal Junction", Phys. Review B, 1999, 59(19), 12505.

W. Tian, S. Datta, S. Hong, R. Reifenberger, J.I. Henderson, C.P. Kubiak, "Conductance Spectra of Molecular Wires", J. Chem. Physics, 1998, 109(7), 2874–2882.

D.F. Padowitz, R.J. Hamers, "Voltage–Dependent STM of Covalently Bound Molecules on Si(100)", J. Phys. Chem., 1998, 102, 8541–8545.

S. Datta, W. Tian, S. Hong, R. Reifenberger, J.I. Henderson, C.P. Kubiak, "Current–Voltage Characteristics of Self–Assembled Monolayers by Scanning Tunneling Microscopy", Phys. Rev. Let., 1997, 79(13), 2530–2533.

C.H. de Villeneuve, J. Pinson, M.C. Bernard, P. Allongue, "Electrochemical Formation of Close–packed Phenyl layers on Si (111)", J. Phys. Chem. B., 1997, 101, 2415–2420.

Y–C Liu, R.L. McCreery, "Raman Spectroscopic Determination of the Structure and Orientation of Organic Monolayers Chemisorbed on Carbon Electrode Surfaces", Anal. Chem., 1997, 69, 2091.

C. Joachim, J.K. Gimzewski, R.R. Schlittler, C. Chavy, "Electronic Transparence of a Single C60 Molecule", Phys. Rev. Let., 74(11), 2102–2105.

P. Allongue, M. Delamar, B. Desbat, O. Fagebaume, R. Hitmi, J. Pinson, J.M. Saveant, "Covalent Modification of Carbon Surfaces by Aryl Radicals Generated from the Electrochemical Reduction of Diazonium Salts", J. Am. Chem. Soc., 1997, 119, 201–207.

C.P. Andrieux, F. Gonzales, J.M. Saveant, "Derivatization of Carbon Surfaces by Anodic Oxidation of Arylacetates, Electrochemical Manipulation of the Grafted Films", J. Am. Chem. Soc., 1997, 119, 4292–4300.

Peihong Chen, R.L. McCreey, "Control of Electron Transfer Kinetics at Glassy Carbon Electrodes by Specific Surface Modification", Anal. Chem., 1996, 68, 3958.

M.T. Cygan, T.D. Dunbar, J.J. Arnold, L.A. Bumm, N.F. Shedlock, T.P. Burgin, L. Jones, D.L. Allara, J.M. Tour, P.S. Weiss, "Insertion, Conductivity, and Structures of Conjugated Organic Oligomers in Self–Assembled Alkanethiol Monolayers of Au(111)", J. Am. Chem. Soc., 1998, 120, 2721–2732.

Y. Xia, N. Ventateswaran, D. Qin, J. Tein, G.M. Whitesides, "Use of Electroless Silver as the Substrate in Microcontact Printing of Alkanethiols and Its Application in Microfarication", Langmuir, 1998, 14, 363–371.

D.G. Walter, D.J. Campbell, C.A. Mirkin, "Photon–Gated Electron Transfer in Two–Component Self–Assembled Monolayers", J. Phys. Chem. B., 1999, 103, 402–405.

G.S. McCarty, P.S. Weiss, "Scanning Probe Studies of Single Nanostructures", Chem. Rev., 1999, 99, 1983–1990.

Y. Xia, J.A. Rogers, K.E. Paul, G.M. Whitesides, "Unconventional Methods for Fabricating and Patterning Nanostructures", Chem. Rev., 1999, 99, 1823–1848.

D.H. Gracias, J. Tien, T.L. Breen, C. Hsu, G.M. Whitesides, "Forming–Electrical Networks in Three Dimensions by Self–Assembly", Science, 2000, 289, 1170–1172.

D.I. Gittens, D. Bethell, R.J. Nichols, D.J. Schiffrin, "Diode– Like Electron Transfer Across Nanostructured Films Containing a Redox Ligand", J. Mater. Chem., 2000, 10, 79–83.

M.P. Schwartz, M.D. Ellison, S.K. Coulter, J.S. Hovis, R.J. Hamers, "Interaction of π–Bonded Semiconductor Surfaces: Structure, Selectivity, and Mechanistic Implications", J. Am. Chem. Soc., Web Edition 2000.

R.J. Hamers, S.K. Coulter, M.D. Ellison, J.S. Hovis, D.F. Padowitz, M.P. Schwartz, C.M. Greene, J.N. Russell, "Cycloaddition Chemistry of Organic Molecules with Semiconductor Surfaces", Acc. Chem. Res., 2000.

J.S. Hovis, S.K. Coulter, R.J. Hamers, M.P. D'Evelyn, J.N. Russell, J.E. Butler, "Cycloaddition Chemistry at Surfaces: Reaction of Alkenes with the Diamond (001)–2×1 Surface", J. Am. Chem. Soc., 2000, 122, 732–733.

J.J. Storhoff, A.A. Lazarides, R.C. Mucic, C.A. Mirkin, R.L. Letsinger, G.C. Schatz, "What Controls the Optical Properties of DNA–Linked Gold Nanoparticle Assemblies?", 2000, 122, 4640–4650.

M.D. Musick, C.D. Keating, L.A. Lyon, S.L. Botsko, D.J. Pena, W.D. Holliway, T.M. McEvoy, J.N. Richardson, M.J. Natan, "Metal Films Prepared by Stepwise Assembly, 2 Construction and Characterization of Colloidal Au and Ag Multilayers", Chem. Mater., WEB 2000.

* cited by examiner

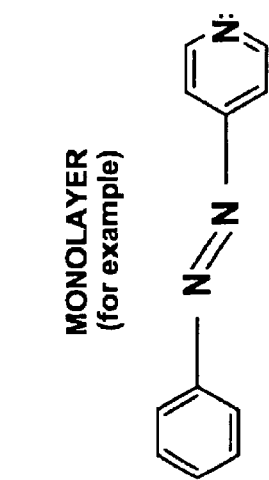
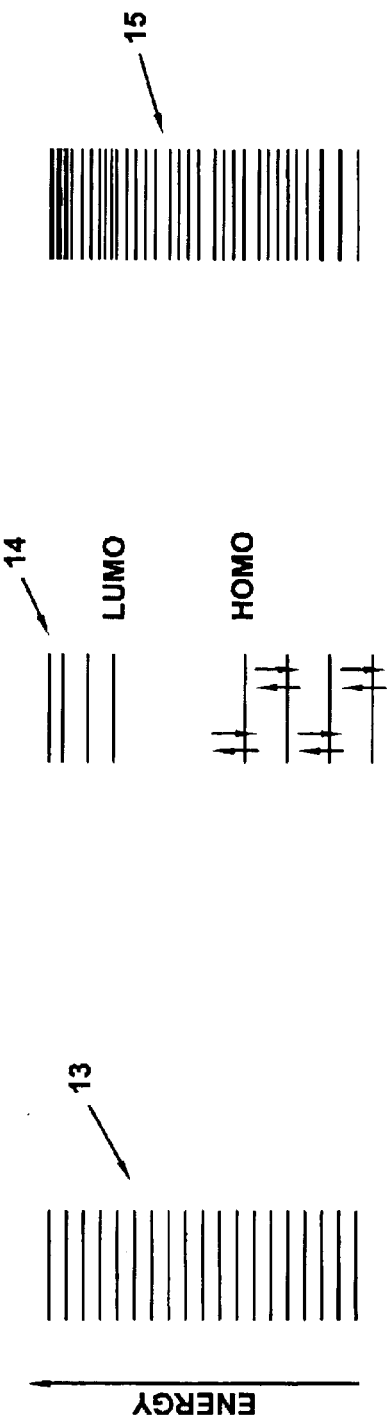
FIG. 3A CARBON FILM
FIG. 3B MONOLAYER (for example)
FIG. 3C METAL FILM
FIG. 3D carbon orbitals
FIG. 3E molecular orbitals
FIG. 3F metal orbitals

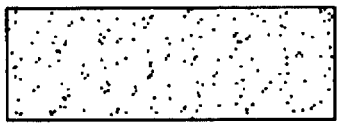
FIG. 4B
METAL FILM
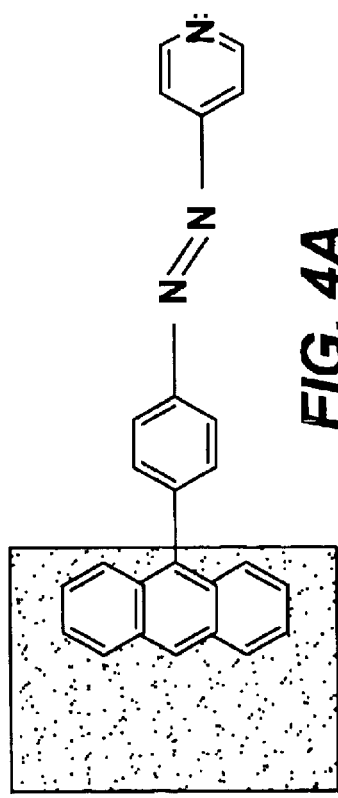
FIG. 4A
Chemically bonded organic monolayer on PPF
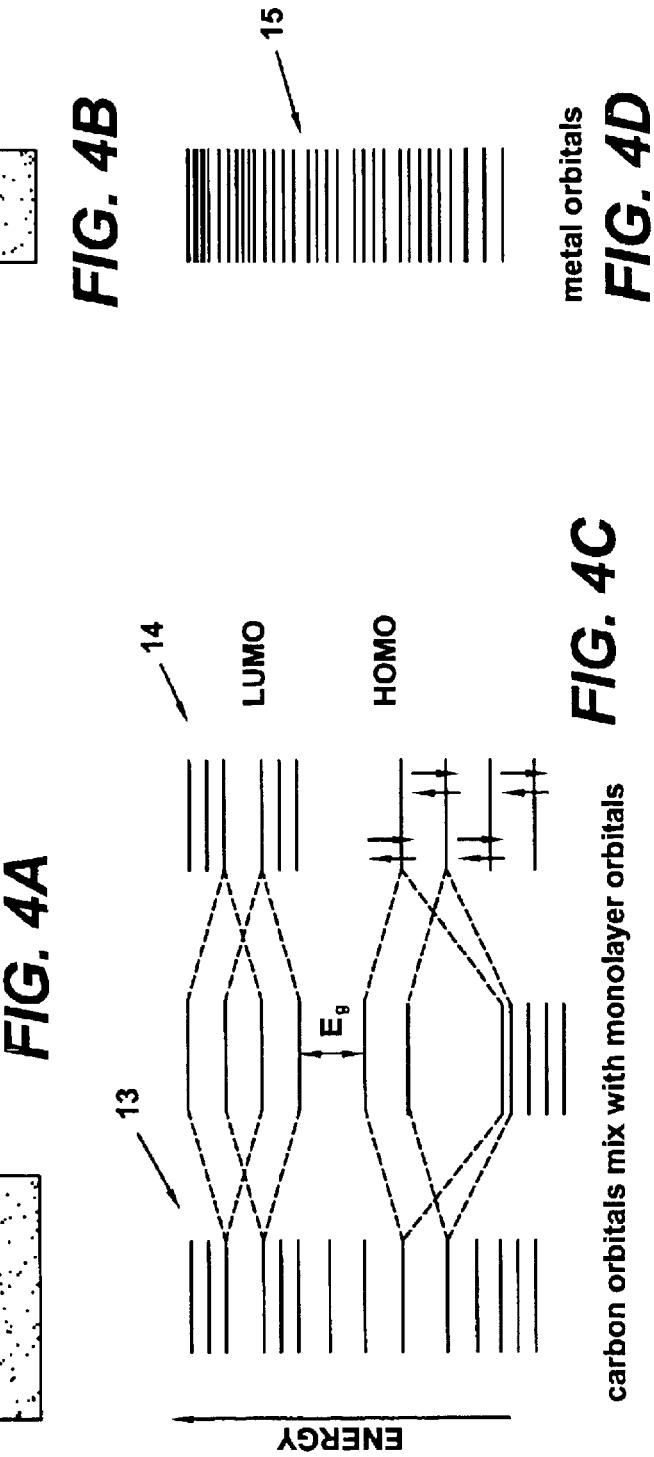
FIG. 4C
carbon orbitals mix with monolayer orbitals
FIG. 4D
metal orbitals

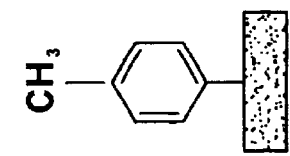
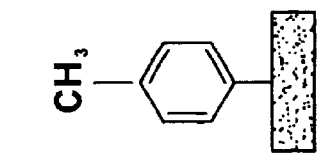
FIG. 12A  FIG. 12B  FIG. 12C  FIG. 12D  FIG. 12E
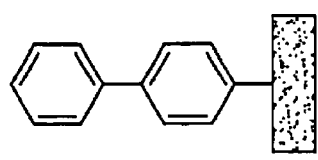
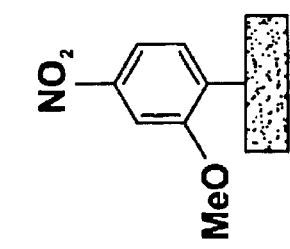
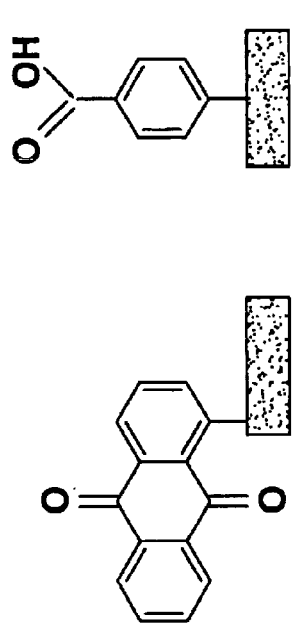
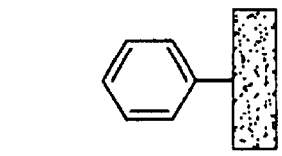
FIG. 12F  FIG. 12G  FIG. 12H  FIG. 12I  FIG. 12J
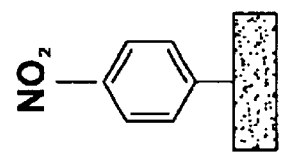
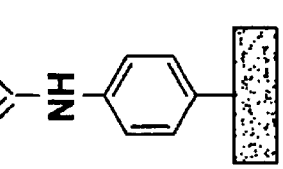
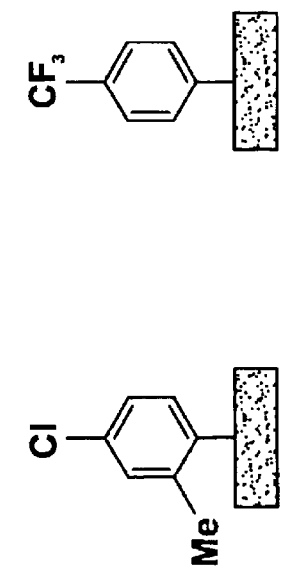

PIXEL ARRAY

RELATED APPLICATIONS

This application is a divisional application of U.S. application Ser. No. 09/755,437 filed Jan. 5, 2001, the contents of which is incorporated herein by reference.

TECHNICAL FIELD OF THE INVENTION

The present invention is in the field of chemical monolayers and microelectronic junctions, and includes chemical sensors, photosensors and other devices containing them.

BACKGROUND OF THE INVENTION

The term "molecular electronics" has been used to describe phenomena or devices that include a molecule as a circuit element (1,2). The motivation for the field is the prospect of making extremely small (potentially one molecule) electronic components with a much wider range of functions than conventional semiconductor electronic devices. If molecular devices become practical, a wide variety of applications in microelectronics, computing, imaging and display technology and chemical sensing can be envisioned. The large majority of proposed molecular electronic devices are based on the Gold-thiol system (Au/thiol), in which organic mercaptans "self assemble" on a flat gold surface to form an ordered monomolecular layer (3–6). In many cases, scanning tunneling microscopy of the Au/thiol layer or of gold particles thereon reveal the electron transfer characteristics of the monolayer molecule. However, the Au/thiol system forms films with many pinhole defects, so only a very small region (less than 30×30 nm, typically) can be examined without pinholes that result in short circuits. An alternative approach involves placing a single layer of molecules between two metal or metal oxide surfaces using Langmuir-Blodgett technology (7,8). In these experiments, the current/voltage behavior of a layer of molecules may be obtained, with the current path extending through the molecule itself.

While these experiments demonstrate certain characteristics of molecules as electronic components, they have severe disadvantages when considered for practical uses. First, the apparatus required is extremely complex and difficult to use, and so far has only been successfully implemented on a limited scale in very sophisticated laboratories. Second, both approaches result in films with unavoidable defects that limit both the size and lifetime of the devices. Third, the Au/thiol or Langmuir-Blodgett approaches to binding the molecule to two conductors generate large energy barriers that reduce current flow. The sulfur atom represents an "aliphatic" barrier that decreases electronic coupling between conductor and molecule. The Langmuir-Blodgett approach requires metal oxide films that purposely decouple the molecule from the conductor in terms of electronic interactions. When the molecule is electronically decoupled from the conductor, many potentially valuable applications of molecular electronics are prevented. Fourth, STM interrogates one or a few molecules at a time, so the massive parallelism inherent in microelectronic devices is difficult to conceive. These fundamental problems inherent in Au/thiol or Langmuir Blodgett devices prevent any conceivable practical application in the foreseeable future.

Independent of the field of molecular electronics was the development of methods for covalent bonding of molecular monolayers to carbon substrates such as carbon fibers and polished glassy carbon (9–11). These methods led to a robust monolayer that is conjugated with the carbon substrate through a strong carbon-carbon bond. Unfortunately, applications to molecular electronics are not possible with known technology because the surfaces are too rough. No one has succeeded in making a contact to the top of the monolayer because of substrate roughness that is much greater than the thickness of the monolayer. Only recently (12) has anyone made a carbon surface which is both smooth on a molecular scale, and amenable to covalent bonding of molecular layers.

None of the prior art meets the requirements for a practical molecular electronic device. They all are too difficult to make, prone to defects and pinholes, unstable, and require exceedingly sophisticated laboratory equipment to fabricate and study. In order to make a practical molecular electronic device based on molecular monolayers, the following requirements (at least) must be met:

1. The monolayer should be sufficiently flat and pinhole-free, so as to reduce or prevent short circuits.
2. There should be covalent bonding between at least one (and preferably both) of the conductors and the monolayer, so as to increase electronic coupling.
3. The monolayer may be a conjugated organic molecule, which in turn is conjugated with the pi electron system in the conductive substrate, making the resulting electronic coupling quite different from that in Au/Thiol layers.
4. The chemical bond of the monolayer to the conductive substrate should be strong and stable, and preferably not subject to oxidation in air.
5. After a metal layer is deposited to the top of the monolayer (by chemical deposition, vapor deposition, or electrodeposition) the junction is no longer an electrochemical system, and does not require ion motion or a solution.
6. It should be possible to encapsulate, possibly after fabrication of a complex circuit pattern, so as to make possible the fabrication of microelectronic junctions and devices using them.

SUMMARY OF THE INVENTION

The present invention includes chemical monolayer construction, electronic constructions and devices containing one or more of those constructions.

In broadest terms, the chemical monolayer construction of the present invention comprises: (a) a substrate having a contact surface; and (b) a plurality of substantially parallel molecular units, wherein said molecular units are attached to said substrate so as to be strongly coupled electronically to said substrate. The present invention also includes a chemical monolayer construction comprising: (1) a substrate having a contact surface; and (2) a plurality of substantially parallel molecular units attached to said contact surface of said substrate, wherein said molecular units are attached to said substrate through a conjugated bond.

As used herein, the term "strongly coupled electronically" is used to indicate that the substrate(s) and monolayer share common molecular orbital(s) (one or more), and thus that electrons are delocalized over both the monolayer and substrate. This also refers, in the case of an organic moiety, to electronic coupling that is at a level greater than the aliphatic equivalent of the bond in question. A conjugated bond is one example of strong electronic coupling. At least some of the important features of the present invention are believed to be due to perturbation of the molecule's orbital(s) by the substrate, which stems from strong electronic coupling. The chemical monolayer of the present invention thus allows for the creation of a relatively large number of molecules conducting in parallel, the conduction being essentially parallel to the axis of the molecular units.

The roughness parameter relates generally to the ability of the monolayer to electrically connect to the respective substrate surface(s)/conductive component(s) without substantial number of areas or total area of conductance breakdown (referred to as "holes" or "shorts"). Naturally, depending on the degree of conductivity of the monolayer and its constituent molecular units, the monolayer junctions and devices may tolerate greater or lesser number and/or size of shorts attendant to non-uniformity in the contact between the monolayer and the electrically contacted substrate or conductive components.

Accordingly, the base present invention in broadest terms is not limited to any degree of roughness in the constituent substrate surfaces. However, for monolayers such as those described below, the root-mean-square (RMS) roughness typically will be within a range of less than 200 Angstroms, most preferably at a level of 5 Angstroms.

The contact substrate may be any substrate adapted to have a surface that may be produced or rendered to the specified smoothness by any appropriate method and that may be amenable to conjugated bonding. For example, the contact substrate may be conductive carbon, such as one comprising or consisting essentially of conductive carbon, for example preferably a surface of a pyrolyzed carbon, such as a pyrolyzed photoresist film (PPF). When the substrate is carbon, the electronic properties of the substrate may be varied such as through variance of the precursor (e.g., anthracene, polyacrylonitrile, etc.) or variance in the deposition technique (e.g., heat treatment or cold sputtering). This allows one to vary the electronic properties of the substrate as well as the monolayer.

Preferably, the contact substrate surface typically will have a mean roughness value less than 500 Angstroms, preferably less than 100 Angstroms, and most preferably less than 20 Angstroms, and even as little as 5 Angstroms.

The molecular units may be any moiety capable of providing a conjugated bond to the first contact surface, and typically will contain at least three atoms. Typically, the size of the molecular unit will be at least as large as a benzene ring, and may have any degree of conjugation across its length, and may contain any number of heteroatoms in accordance with the desired conductivity or function (e.g., whether the desired device is to be tuned to a certain wavelength for photodetection or photodiode activity, or whether a metal-sensitive device is produced as described herein).

Preferably, the molecular units are of such dimension that holes or shorts in the chemical monolayer are not so substantial as to affect functionality. Preferably, the molecular units are of one or more types of substantially the same lengths. In this same regard, it is preferred that the contact surface of the substrate preferably has a roughness value that is smooth enough to avoid significant degradation in function of the monolayer. Preferably, the roughness value is substantially less than or equal to the maximum length of the molecular unit(s), or preferably less than or equal to the average of various lengths of the molecular unit types where more than one molecular unit type is used. One of the essential characteristics of the monolayers of the present invention is that an electronic current may be made to pass substantially through the molecules. There may be small areas of "short circuit" in some instances, but the value of the invention stems from making the molecular unit(s) part of an electronic circuit.

The present invention is based upon the creation of the chemical monolayer between aligned, i.e., substantially parallel, molecular units that are electrically conductive.

As used herein, the term "molecular units" shall be understood as including any chemical moiety covalently bonded to at least one of the electrode surfaces (e.g., that referred to herein as the "first" surface for the purpose of describing a single-layer device).

The molecular units typically will be organic moieties that may have varying degrees of conjugation throughout their length, although inorganic equivalents are possible that might still be strongly electrically coupled. The molecular units may be monomeric or polymeric and may be of varying length depending upon the desired application, such as to vary the junction or device with respect to conductivity, the ability to bond one or more chemical species, or the desire to tune the molecular orbital(s) for any purpose, such as those described herein.

The molecular units in the chemical monolayer will be aligned such that they reside in parallel planes or along parallel lines, depending upon the size and shape of the molecular units. That is, where the molecular units are substantially linear, they will be aligned such that their principal longitudinal axes are substantially parallel. Typically, these longitudinal axes will be substantially perpendicular to the electrode surface(s) to which they are chemically attached or otherwise come into electrical contact. Naturally, the molecular units in many instances may not be precisely perpendicular to the surface of the substrate depending upon their geometric structure.

Also, where one or more type of the molecular units comprise angled portions, they shall be considered substantially parallel where corresponding planes encompassing atoms of at least one given type of the molecular units are parallel.

The present invention may also include mixed monolayers with molecular units of varying types, having the characteristics described above.

In a preferred embodiment, the present invention also includes a chemical monolayer construction, the construction comprising: (a) a contact surface; and (b) a plurality of substantially parallel molecular units, each of substantially the same length and attached to the contact surface, wherein the molecular units are attached to the contact surface through a conjugated bond; wherein the contact surface has a roughness value that is substantially less than or equal to the length of the substantially parallel molecular units.

The electronic junction of the present invention in general terms comprises: (a) a first conductive component, the first conductive component comprising: (i) a contact surface; and (ii) a plurality of substantially parallel molecular units having first and second ends, each of the parallel molecular units of substantially the same length and attached through its first end to the contact surface through a conjugated bond, and wherein the contact surface has a roughness value that is substantially less than or equal to the length of the substantially parallel molecular units; and (2) a second conductive component in electrical contact with the second ends of the substantially parallel molecular units.

The second contact may be of any appropriate conductive or semi-conductive solid or liquid material, such as a metallic solid or liquid or conductive vacuum-deposited, electro-deposited material or solution deposited material, such as vacuum-deposited metal layer or another carbon layer.

The chemical monolayers and electronic junctions of the present invention may be used to create a wide variety of electronic circuitry and devices analogous to known electronic circuitry and devices. By varying the size, structure, and chemical nature of the molecular unit(s) of the monolayer constituents, as well as the nature of the conductive members attached thereto, the electronic character of the electronic junction may be varied from an insulator to a semiconductor to a conductor. For instance, the degree of conjugation in the molecular unit(s) enhances the perturbation of the molecular orbitals in the assembled electronic junction. For instance, the band gap (e.g., the HOMO/LUMO gap) of the molecule may be significantly altered by covalent bonding. Accordingly, as used herein, change in electronic character shall be understood as including any change in electrical characteristic(s) that may be qualitatively and/or quantitatively assessed, or that otherwise lead the chemical monolayer or electronic junction to perform an electrically driven function, such as change in resistance, conductivity, tunneling capacity, capacitance, etc., consistent with the desired application of the chemical monolayer or electronic junction.

The electronic circuitry and devices of the present invention may be made by supplementing or complementing their structure using constructions and arrangements known and used in the electronic arts.

For instance, the chemical monolayers and electronic junctions of the present invention may be used to make a wide variety of electronic devices and circuit elements, such as semi-conductors. This may be done by applying or incorporating the present invention along with known microcircuitry constructions and arrangements, and/or through the use of known construction techniques, such as vacuum deposition, metal sputtering and lithographic photoresist techniques.

The monolayers may also be used as chemical detectors or analyzers by producing them with molecular units that may be sensitive to more than one species (discreetly or non-discreetly), typically from a gas or liquid phase, such as being sensitive to single- or multi-valent ions per se or being sensitive to both magnesium and iron, for instance. They may also be made to be influenced by changes in pH, ionic strength, the presence or absence of an inorganic or organic species, or even to be influenced by static charge or particulates. That is, to make a chemical detectors or analyzer, one need only produce a monolayer whose combined molecular orbitals are such that the electronic junction is sensitive to the presence of any one or more of the above-described agents or influences (i.e., such that in some way the electronic character of the junction detectably changes; i.e., change in conductivity, etc.). This allows for the use of circuitry and devices, such as those known and used in the electronic arts, to detect the change in electronic character, making quantitative and/or qualitative analysis possible.

For instance, a molecular unit type may be capable of chelating a given metal or group of metals. A molecular unit might likewise be adapted to bind organic molecules through functional group interaction between the molecular unit and the analyte species of interest. This may be extended to fields of biochemistry and molecular biology by providing molecular units that contain structures to simulate the active site of an enzyme, or to provide complementary RNA or DNA sequences for nucleotides of interest.

There may be a number of variations, such as using one or more specific types of molecular units (e.g., sensitive respectively, for instance, to different metal ions), and these may be placed in the same or different regions of a monolayer junction; or different monolayers of each molecular unit type for each target analyte may be created and serviced by independent circuitry for analysis purposes.

In other variations, the chemical monolayer of the present invention may be designed with molecular units that are prepared with one or more already bound substances, such as metals, bound organic moieties, etc., that are stimulated to be released upon coming into contact with or under the influence of the target specie(s) or condition(s), so as to change the electronic character of the molecular unit, making quantitative and/or qualitative analysis possible.

For a photodetecting electronic junction or device, at least some of the molecular units need only be such that the monolayer is sensitive to electromagnetic radiation. That is, to make a photosensor, one need only produce a monolayer whose combined molecular orbitals are such that the electronic junction is sensitive to electromagnetic radiation (i.e., such that in some way the electronic character of the junction detectably changes; e.g., change in conductivity, etc.). Stimulation of conductivity through the monolayer by light of energy greater than the band gap allows for the creation of a photosensor. This allows for the use of circuitry and devices (such as those known and used in the electronic arts) to detect the change in electronic character, making quantitative and/or qualitative photodetection possible.

The mechanism of excitation from a highest occupied molecular orbital (HOMO) to a lowest unoccupied molecular orbital (LUMO) is one mechanism for photosensitivity, but there may be others, and the present invention is not limited to any given mechanism.

There may be several arrangements or mechanisms that may bring about this result, as may be understood from the fields of physical chemistry and molecular orbital theory. One mechanism is that the excitation from a HOMO to a LUMO in the molecular unit leads to a change in the conductivity. This allows the electronic junction or device of the present invention to exhibit photosensitivity. For example, the bound molecular unit may form an occupied molecular orbital and an unoccupied molecular orbital, the occupied molecular orbital may contain an electron that may be elevated to the unoccupied molecular orbital by incident electromagnetic radiation so as to alter the conductivity of the at least some of the molecular units.

For a photodiode or photo-emitting junction or device at least some of the molecular units form an occupied molecular orbital and an unoccupied molecular orbital. The occupied molecular orbital contains an electron that may be elevated or injected to the unoccupied molecular orbital by the passage of current through the at least some of the molecular units. This high-energy electron may relax to a lower orbital resulting in the emission of electromagnetic radiation. The emission may be of any wavelength or combination of wavelengths; i.e., ultraviolet, infrared, visible. The emission may also be pumped so as to cause the device to emit laser light. The chemical monolayer may also be constructed such that it gives rise to an array of molecular orbitals capable of producing laser light upon stimulation.

In this embodiment, it is preferred that at least one of the first and second conductive components be translucent or transparent to the electromagnetic radiation wavelength(s) of interest.

In another embodiment, the chemical monolayers and the electronic junctions of the present invention may be used to control optical transmission or reflection. This may be done by providing with electrical or optical stimulation so as to alter the reflectivity or transmissibility of the monolayer. Accordingly, the chemical monolayer of the present invention may be formed into an electrically or optically controlled photon gate for use in photonic circuits and devices. The chemical monolayers of the present invention also may be formed into patterns to create visual displays, such as display panels for electronic devices or public displays and signage.

It has also been observed that the monolayer may be "switched" from a relatively high (e.g., 1 megohm) to a relatively low (e.g., ~2 kohm) resistance state, and that it stays in the "low" state for at least 1 hour. This process may be cycled many times, allowing for the production of a "memory device". In principle, the "memory cell" could be as few as a few molecular units, leading to high density memories. The electronic analog is a "Schmidt trigger" which may be repeatedly switched on and off. Several possible devices may be made by incorporating this form of the monolayer or electronic junction of the present invention. These may include: (a) a disk drive consisting of a monolayer on a flat, spinning surface, with a "read head" that activates and probes the memory cells; and (b) where the molecular units may be "switched" optically, a sheet of chemical monolayer of the present invention may become a photosensitive array. The "image" of molecules that had been switched on by light could be read out electronically. This allows for the production of a camera, and one that may also be made to have sensitivity in a wide variety of electromagnetic spectral regions, including the infrared as well as visible spectral regions.

The transparency or reflectivity of a monolayer of the present invention (preferably with a translucent top layer/contact of an appropriate material) may be altered by the applied potential. For example, by the LUMO being filled, the transparency or reflectivity of the monolayer may be altered. Accordingly, an electrical circuit incorporating a monolayer of the present invention could be made to modulate light. This important characteristic may be applied to produce a wide variety of devices including video projection equipment, fiber optic network switches, etc., where the use of an electrical circuit to modulate light may be used with advantage.

The monolayer of the present invention may also be used to create electronic devices and circuit components such as semiconductors and integrated circuits. In this regard, because the HOMO/LUMO gap can be tuned by chemical structure, the present invention may have wide applications to semiconductor technology. In contrast to current semiconductors that are limited by the band gaps available in certain crystals (e.g., Si, Ge, etc), the band gap that may be used in semiconductors incorporating the monolayer of the present invention develops inside the monolayer itself. Accordingly, a highly variable band gap (or many different gaps in some heterostructure-containing monolayers of the present invention) may be extremely valuable.

The monolayer of the present invention may be tuned from an insulator to a semiconductor to a conductor as desired in accordance with the requirements of a given electronic device to be produced.

Additional applications for the monolayer of the present invention include (a) photosensors, (both single and array (e.g., these may be used to produce devices such as digital cameras and medical imagers) (b) chemical sensors (c) organic semiconducting junctions (d) computer displays (e) memory devices (e.g., disk drives) (f) photonic devices, including photonic electronic junctions (e.g. fiber optic network routers) (g) lasers and laser arrays and (h) photo-emitter arrays.

The present invention also includes a multi-layer electronic junction or device that corresponds to the single layer device described above. The present invention thus includes a multi-layer electronic junction or device comprising: (a) a first conductive component, the first conductive component comprising a first contact surface; (b) a first plurality of substantially parallel first molecular units having first and second ends, each of the parallel first molecular units of substantially the same length and attached through its first end to the first contact surface through a conjugated bond, and wherein the first contact surface has a roughness value that is substantially less than or equal to the length of the substantially parallel first molecular units; (c) a second conductive component having first and second sides, the first side in electrical contact with the second ends of the parallel first molecular units, and the second side having a second contact surface; (d) a second plurality of substantially parallel second molecular units having first and second ends, each of the parallel second molecular units of substantially the same length and attached through its first end to the second contact surface through a conjugated bond, and wherein the second contact surface has a roughness value that is substantially less than or equal to the length of the second substantially parallel molecular units; and (e) a third conductive component having first and second sides, the first side in electrical contact with the second ends of the parallel second molecular units.

The molecular units between the first and second conductive components may also be chemically bound, preferably with conjugated bonds, to both conductive components. Likewise, the molecular units between any subsequent pair of conductive components, such as the second and third conductive components, may also be chemically bound, preferably with conjugated bonds to both respective conductive components.

The deposition of a metal or conducting carbon film on top of the monolayer should permit electrical contact of the monolayer from both ends.

The spacing between the conductive element (i.e. the thickness of the monolayer) may be as small as one benzene ring up to quite large values (>100 A). Variable spacing may be adjusted to affect the electron transfer rate across the monolayer, and therefore the resistance between conductors.

The molecular orbitals of the monolayer should combine with those of the conductive element (e.g., the PFF and metallic conductors), significantly affecting the electrical and optical properties of the structure. Examples of changes that might be brought about include in changes in the energy levels of the monolayer that might occur upon bonding to one or two conductors are shown in FIGS. 4 and 5.

The energy levels of the monolayer molecule may provide energy levels between the conductors, thus affecting electron tunneling and conductivity. For example, if the lowest unoccupied molecular orbital (LUMO) of the monolayer is at a suitable energy, electrons may transfer through the layer at a rate much faster than the vacuum-tunneling rate or than through a molecule with a LUMO of different energy (i.e., the aliphatic-bound equivalent).

The molecules comprising the monolayer may be photosensitive, with electron transfer between the conductive elements (e.g., PPF and metal) facilitated by light of sufficient energy.

The current/voltage behavior of the junction may exhibit discreet steps related to the molecular orbitals of the molecule.

Because the conductive element may be made from commercial photoresist (such as those commercially from Hoechst Chemicals), it may be patterned lithographically, to make complex shapes down to approximately 1 μm size. This allows the chemical monolayer and electronic junctions and devices of the present invention to be applied to make microcircuitry and microdevices.

The present invention also includes a memory device that operates on a basis similar to that of contemporary disc drive devices. In this regard, chemical monolayers of the present invention may be used to create storage devices by being formed on a planar surface so that data may be written onto them through a writing head device that electronically or optically writes digital data to the memory surface. The chemical monolayer can store information that in turn can be read at low voltage by detecting the regions that have been changed in state either optically or through application of relatively high voltage, similar to a Schmidt trigger device. Accordingly, devices analogous to contemporary memory devices and based upon chemical monolayers of the present invention may be created using electronic and microelectronic construction techniques, components and arrangements known in the art.

The present invention also includes field emitter devices, analogous to those that are the basis of flat panel displays. In these devices, the chemical monolayers of the present invention serve to enhance the efficiency of electron emission in response to applied potential. Electrons emitting from the monolayer may be allowed to strike a light emitter such as a fluorophore-containing surface. These devices may be used to create flat panel displays and screens.

The present invention may also include any combination of molecular circuit components and devices described above by selecting molecular unit types and constructing arrangements or arrays to take advantage of the respective functional character of each type or array of types of monolayers. For instance, depending upon the desired application, one may provide, for instance:
1. Separate regions of differing and discreet molecular unit type construction in accordance with any of the functions described herein (e.g. one region to bind iron ions and another to bind copper ions; or one region sensitive to one EM frequency and another sensitive to another EM frequency).
2. One or more regions of mixed molecular unit type construction (i.e., where one or more regions have more than one molecular unit type in the constituent monolayer, such as a region that is sensitive to either copper or iron by having constituent molecular units respectively sensitive to each), and
3. One or more regions of a one or more molecular unit type construction, where the chemical monolayer is constructed of one or more molecular units that feature more than one active or binding site in accordance with any of the functions described herein. For instance, one or more molecular units that contain a series of moieties adapted to discreetly bind respectively 3 different metal ions, or a series of moieties adapted to discreetly bind respectively 3 different functional groups or nucleotides, or a series of moieties discreetly sensitive respectively to 3 different EM wavelengths. These constructions may permit the construction of devices that exhibit a functional change in electronic character upon the sensation of one, some or all of the chemical species, light wavelengths or combination thereof.

BRIEF DESCRIPTION OF THE DRAWINGS

FIGS. 3A–3F show a schematic of the molecular orbitals of the constituent portions of a molecular electronic junction shown in FIG. 2.

FIGS. 4A–4D show a schematic of the combined molecular orbitals of the carbon PPF and the chemically bonded organic monolayer of a molecular electronic junction shown in FIG. 2.

FIGS. 12A–12J show a variety of types of organic molecular units that may be used as components of the chemical monolayer, in accordance with several additional embodiments of the present invention.

FIG. 15 shows a graph of the current/voltage characteristics taken from experiments conducted on a monolayer described in FIGS. 1 and 1A showing the avoidance of a breakdown region.

DETAILED DESCRIPTION OF THE PREFERRED EMBODIMENT(S)

In accordance with the foregoing summary, the following presents a detailed description of the preferred embodiment of the invention that is currently considered to be the best mode.

Figure 1A:
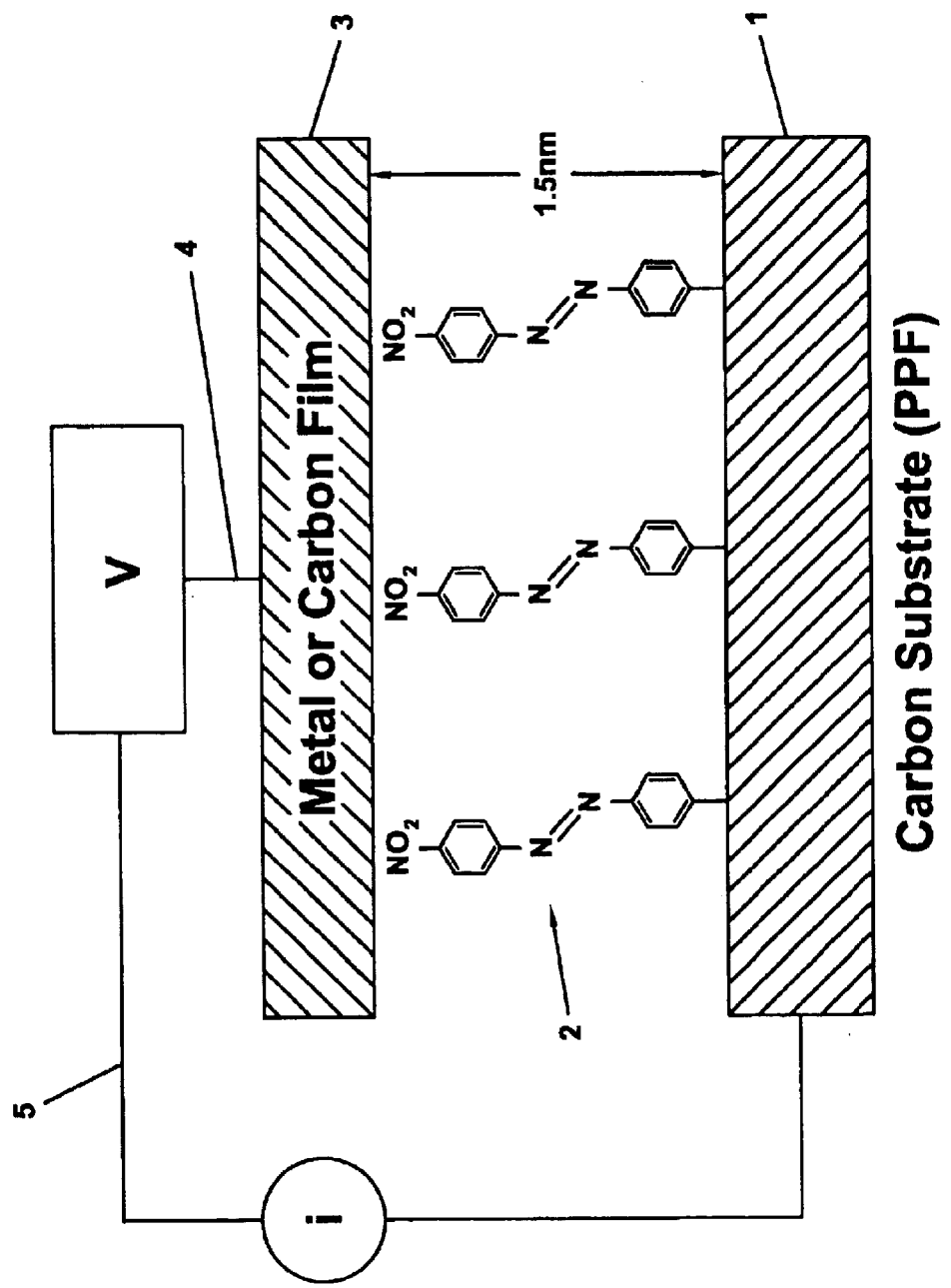
FIG. 1A shows a schematic of a microelectronic junction in accordance with one embodiment of the present invention.

FIG. 1A shows a schematic of a microelectronic junction in accordance with one embodiment of the present invention. FIG. 1A shows a first conductive member 1 or substrate such as a carbon pyrolyzed photoresist film ("PPF"). To this first conductive member 1 is attached a single layer of a plurality of nitroazobenzene molecules (the "chemical monolayer"), covalently bonded to the carbon PPF. The chemical monolayer 2 is disposed between the first conductive member 1 and the second conductive member 3 (i.e. a liquid such as a mercury drop in a device shown in FIG. 1B), with a layer thickness as small as about 1.5 nm. Covalent bonding between the PPF film and the carbon leads to strong, electronic coupling between the molecular monolayer and the carbon PPF. In a finished device, the second conductive member 3 may be any appropriate material, such as a conducting metallic (or carbon) film that may be deposited on top of the monolayer 2.

Figure 1B:
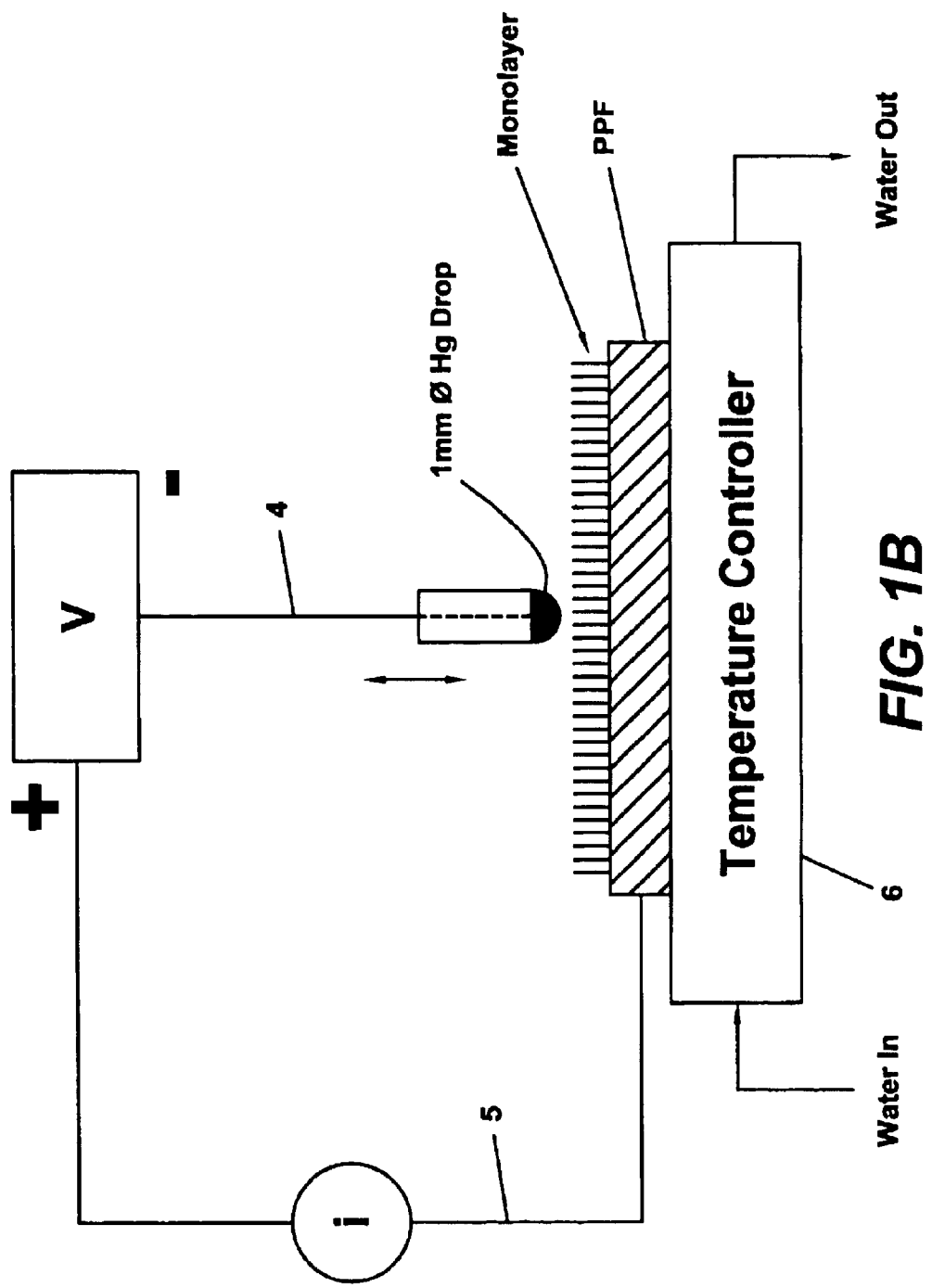
FIG. 1B shows a schematic of a microelectronic junction in accordance with one embodiment of the present invention, and incorporated into a test electronic circuit apparatus.

FIGS. 1A and 1B also show electrical leads 4 and 5, with FIG. 1B showing a mercury drop and optional temperature controller 6.

Conductance through the monolayers of the present invention may be measured using conventional electronic test equipment using voltmeters and oscilloscopes. It has also been observed that tunneling and Shottky emission are operative at the junction between the mercury drop and the chemical monolayer, at low voltage of either polarity. It has further been observed that there is an exponential rise in current until "breakdown" occurs at about −1.1 Volts, when electrons are flowing toward the mercury drop. This breakdown may occur as a result of the buildup of electrons on the molecular units, perhaps in the LUMO. The breakdown is irreversible in some instances, but can be made to be reversible by adjusting experimental parameters.

Figure 2:
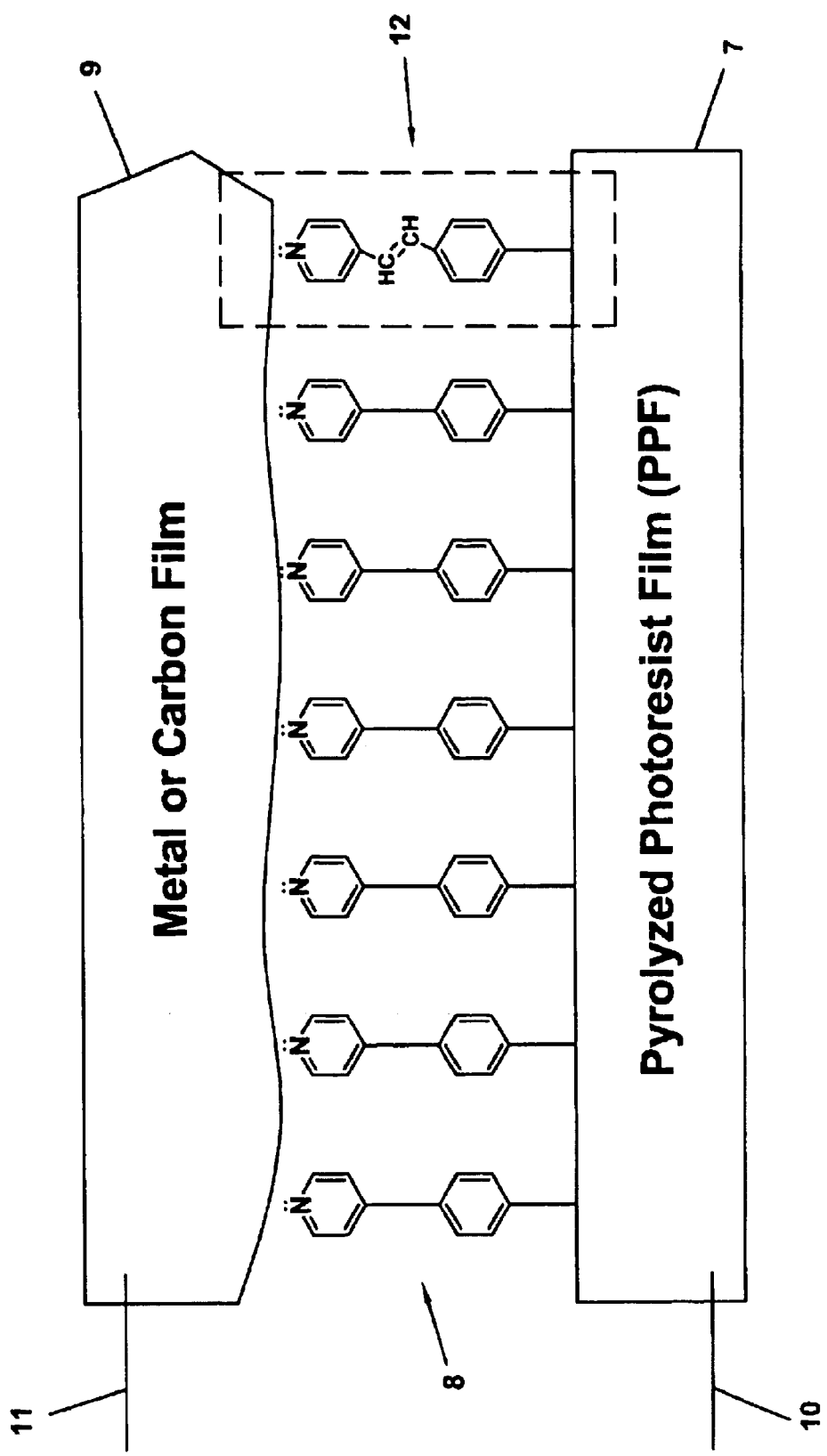
FIG. 2 shows a schematic of a microelectronic junction in accordance with another embodiment of the present invention.

FIG. 2 shows a schematic of a microelectronic junction in accordance with another embodiment of the present invention. FIG. 2 shows a first conductive member 7 or substrate such as a carbon pyrolyzed photoresist film ("PPF"). To this first conductive member 7 is attached a single layer of a plurality of phenyl pyridine molecules (the "chemical monolayer"). The chemical monolayer 8 is disposed between the first conductive member 7 and the second conductive member 9 (i.e. a conducting metallic (or carbon) film), with a layer thickness as small as about 3 Angstroms.

The bonding of the conducting metallic (or carbon) film may be aided by chemical interactions between the metal and the monolayer 8, such as the Au:N interaction where gold is deposited onto phenyl pyridine molecules of the monolayer 8. The resulting structure accordingly may comprise two conductors separated by a molecular monolayer that might have a variety of chemical structures and resulting electrical characteristics. The electrical and possibly optical properties of this assembly depend on tunneling or electrical conduction through the chemical monolayer. Since the monolayer may have a variety of chemical structures, its transfer function (i.e., current vs. voltage response) may be varied greatly, from that of a pure dielectric to that of a conductor, with possibly important intermediate cases. The conduction mechanism may be based upon tunneling, Schottky emission, space charge-limited conduction, the Poole-Frankel effect, etc.

FIG. 2 also shows electrical leads 10 and 11 that may be used to complete an electrical circuit.

FIG. 2 also shows an alternative molecular unit 12 (i.e. a diphenyl ethene moiety) as an example of a molecular unit that may be bound to both the first and second conductive members, i.e., the PPF and a carbon film, respectively. Naturally, this type of arrangement may be obtained depending upon the chemical nature of the conductive members and the molecular unit(s) selected.

FIGS. 3A–3F shows a schematic of the molecular orbitals (13, 14 and 15) of the uncombined constituent portions of a molecular electronic junction similar to that shown in FIG. 2. These Figures show the uncombined molecular orbitals of the carbon film 13, a metal film 15 and an example of a chemical monolayer material 14 that is to connect them.

FIGS. 4A–4D show a schematic of the combined molecular orbitals of the carbon PPF 13 and the chemically bonded organic monolayer 14 of a molecular electronic junction similar to that shown in FIG. 2 with the exception that pyridyl azobenzene is shown as the molecular unit of the chemical monolayer. FIG. 4D also shows the orbital arrangement of the uncombined metal film 14.

Figure 5A:
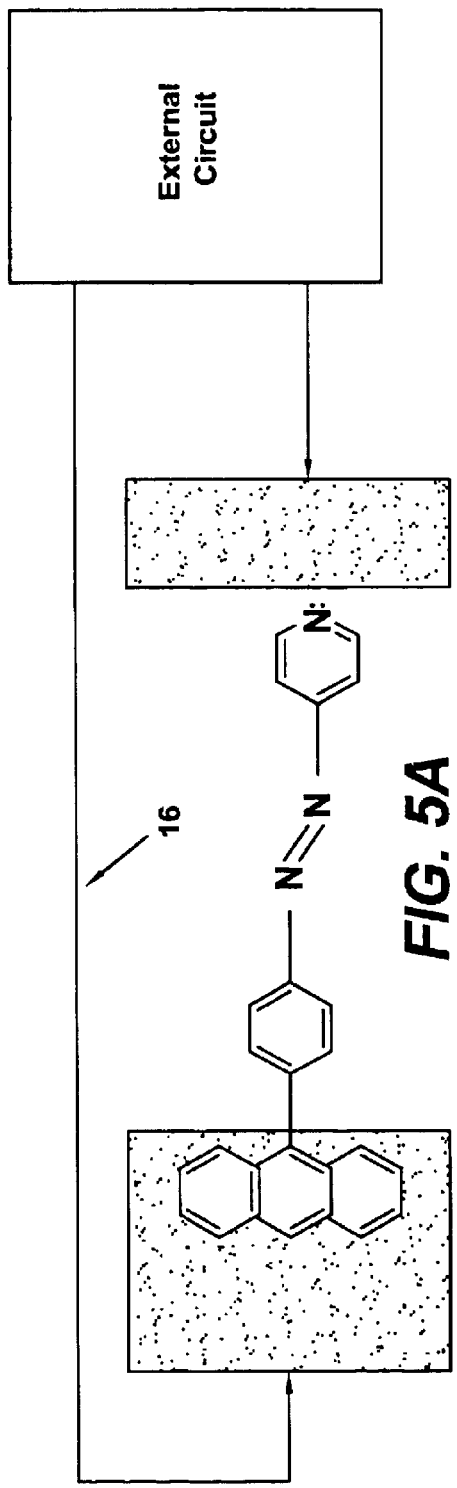
FIGS. 5A and 5B show a schematic of the combined molecular orbitals of the carbon PPF, the chemically bonded organic monolayer, and the metal film of a molecular electronic junction shown in FIG. 2.
Figure 5B:
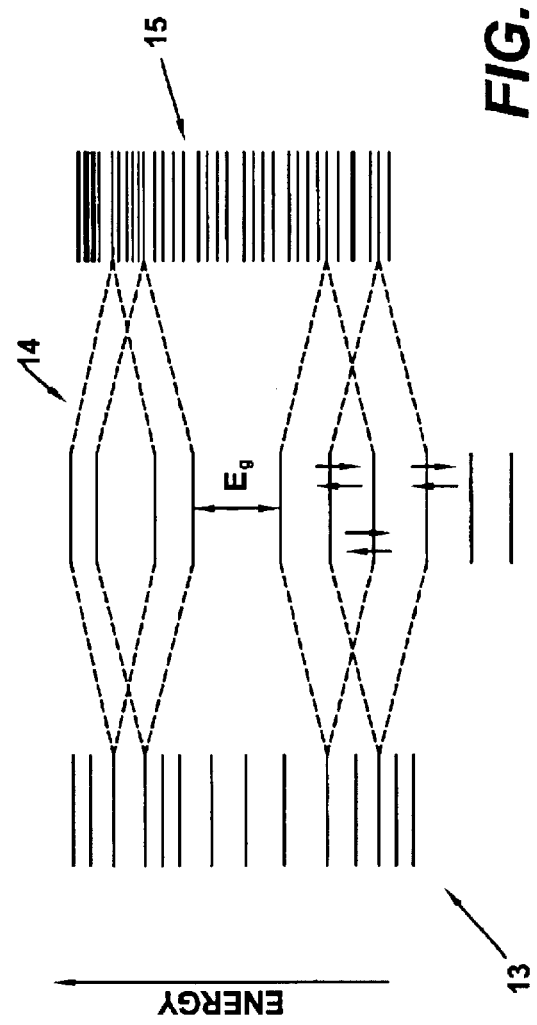

FIG. 5A also shows an external circuit arrangement 16 to be completed by the electronic junction. FIG. 5B shows a schematic of the combined molecular orbitals of the carbon PPF 13, the chemically bonded organic monolayer 14, and the metal film 15 of a molecular electronic junction shown in FIG. 4. FIG. 5B shows that the molecular orbitals mix further with those of the metal, and that the electronic properties of the junction are determined by the molecular orbitals of the monolayer as modified by the bonding to the carbon and metal.

Figure 6:
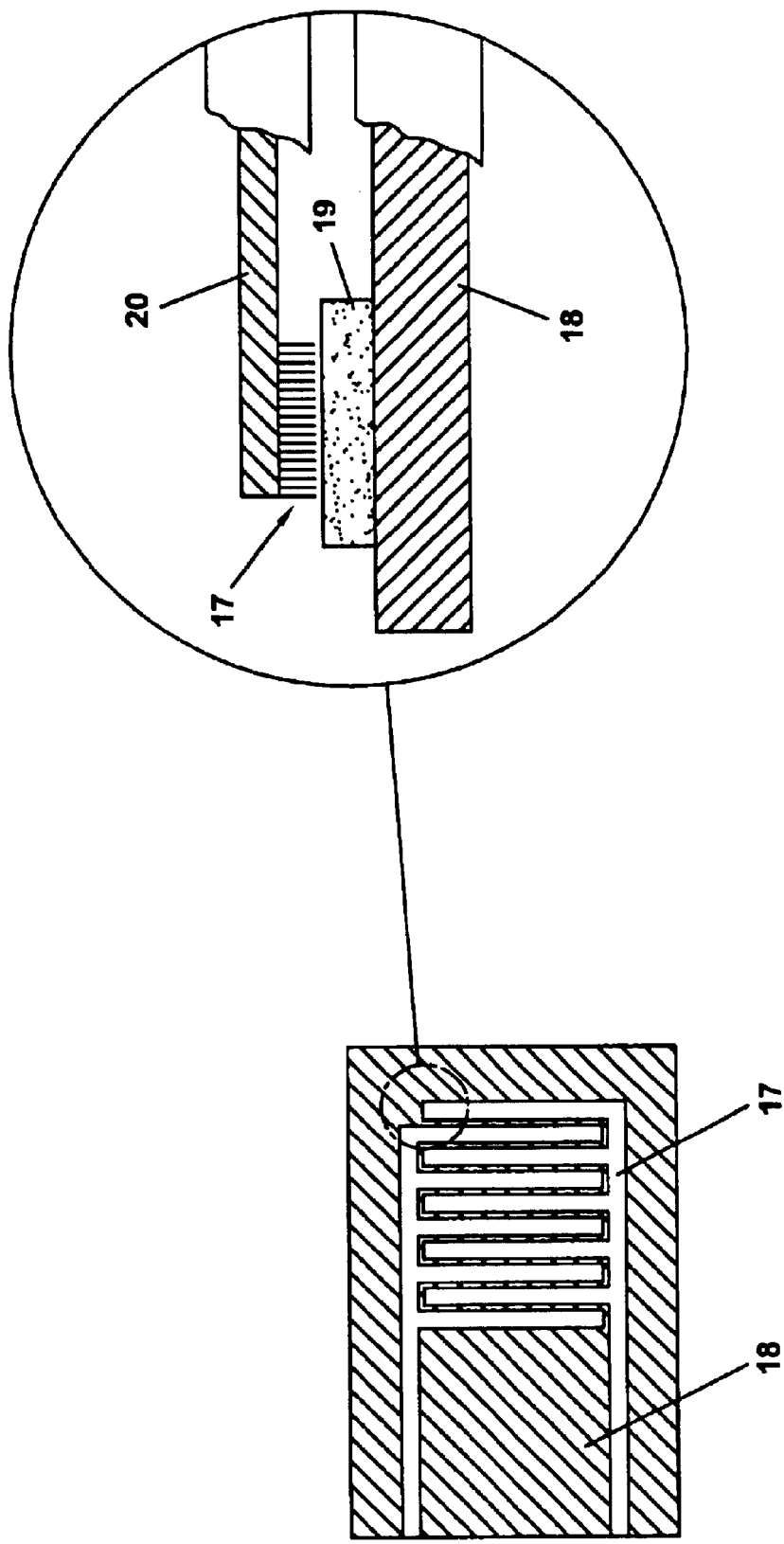
FIG. 6 shows a plan view and cross-section insert of a photomicrograph of a lithographically produced carbon film that may be used in accordance with one embodiment of the invention.

FIG. 6 shows a plan view and cross-section insert of a photomicrograph of a lithographically produced carbon film that may be used in accordance with one embodiment of the invention. The PPF film 17 (e.g., a pyrolyzed AZ4330 photoresist) is placed onto a silicon wafer 18. The photoresist may take any number of a wide variety of shapes or geometric arrangements so as to provide one or more regions that may permit the creation of one or more circuits. The monolayer 19 will be positioned between the patterned carbon film and a possibly correspondingly patterned top contact material, such as a metal contact layer 20. This may be used to produce an array of junctions that can be discreetly interrogated. In FIG. 6, for instance, the interdigitated portions of the photoresist (on the right side of FIG. 6) may be connected by one or more types of chemical monolayers to complete a circuit provided through the electrical lead portion of the photoresist (extending from the left side of FIG. 6). The interdigitated portions of the photoresist in the displayed embodiment are about 25 $\mu$m wide with 15 $\mu$m gaps, although smaller features are possible in accordance with the application of known photoresist processes. The device shown in FIG. 6 was produced using a positive photoresist. However, similar structures may be produced using a negative photoresist.

Figure 7:
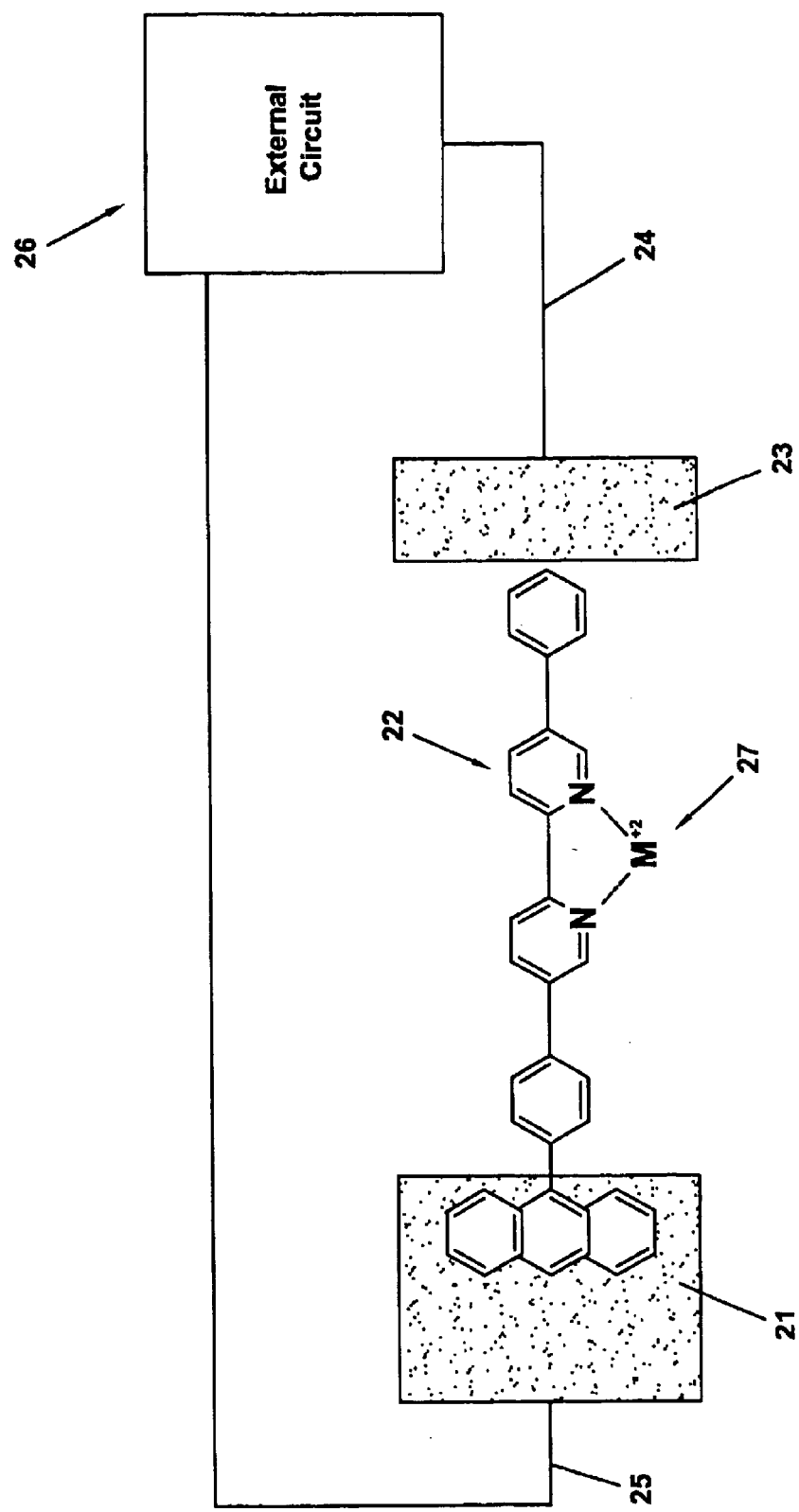
FIG. 7 shows a chemical sensor (i.e., a metal sensor) in accordance with another embodiment of the present invention.

FIG. 7 shows a chemical sensor (i.e., a metal sensor) in accordance with another embodiment of the present invention. FIG. 7 shows PPF carbon film 21 and a molecular unit 22 (of one or more type), a number of which that forms a chemical monolayer. The metal film 23 is also shown. Electrical leads 24 and 25 complete external circuit 26. The presence of a chemical species such as a metal ion 27 (i.e., $M^{2+}$) with which the molecular unit 22 is adapted to complex or bind, or by which the molecular unit(s) 22 otherwise may be electrically influenced. The presence of the metal ion or other species may in this way be ascertained and quantified as desired.

Analogous devices may also be produced that may be sensitive to more than one organic and/or inorganic species (discreetly or non-discreetly), such as being sensitive to ions per se or able to be sensitive to both magnesium and iron, for instance.

Some of the relatively important characteristics of the preferred embodiment include:

1. The pyrolyzed photoresist film (PPF) is very flat, about 5 Angstroms rms roughness (Ranganathan et al. (2000).
2. The monolayer is bonded to the PPF surface covalently, and appears to be quite ordered. The bonding chemistry via diazonium ion reduction is well established (Liu and McCreery, 1995, Pinson, et al., 1992, Allongue, et al. 1991).
3. A small tunneling coefficient of 0.2 $A^{-1}$ is observed for an electron tunneling through the monolayer (Yang and McCreery, 1999) indicating unusual electronic coupling between the PPF and the monolayer.
4. The monolayer thickness may be varied over a wide range by varying the structure of the diazonium reagent.

Figure 8:
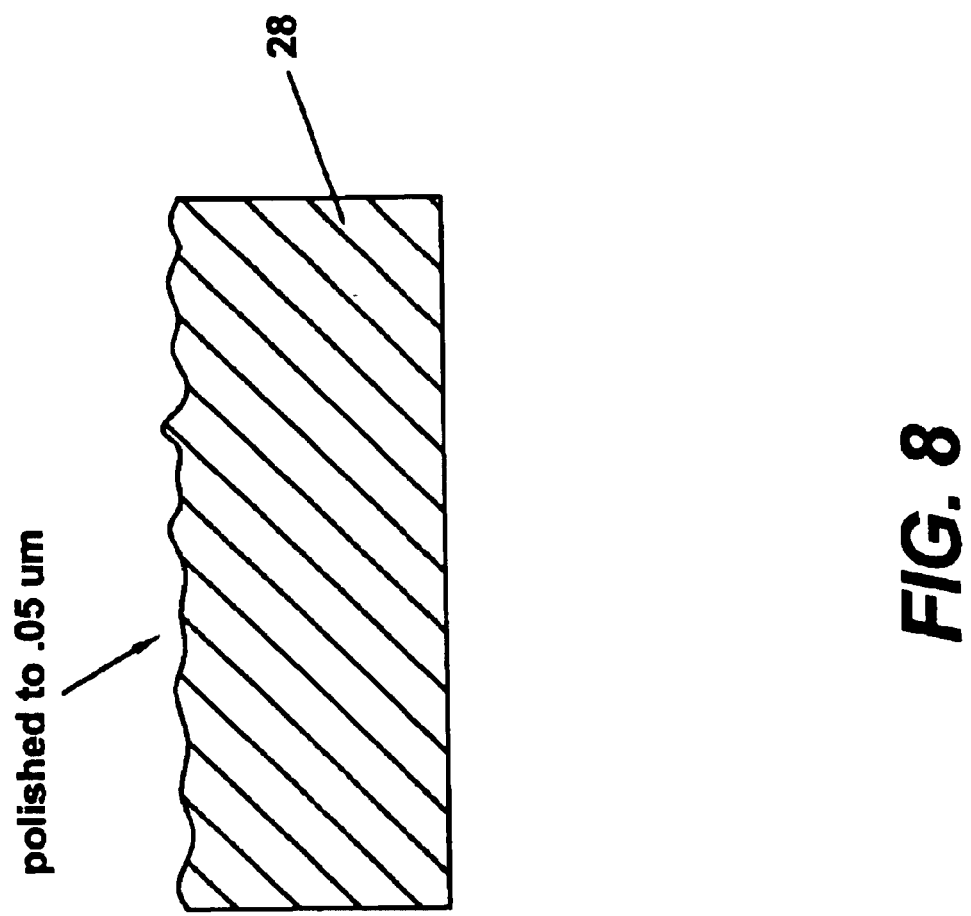
FIGS. 8–10 show a step-wise construction of a monolayer in accordance with one embodiment of the present invention (i.e., showing the chemical monolayer shown in FIG. 1).
Figure 9:
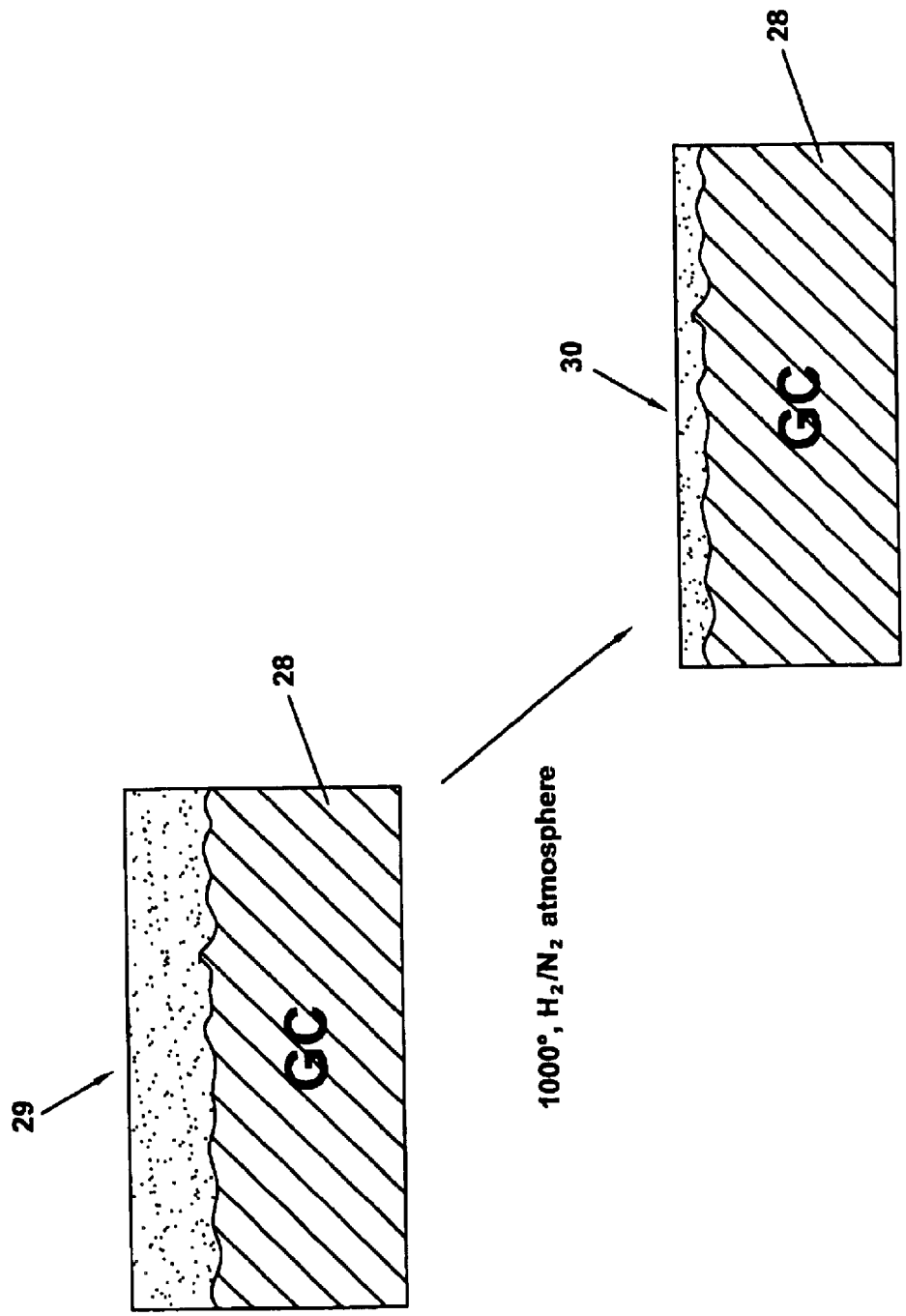
Figure 10:
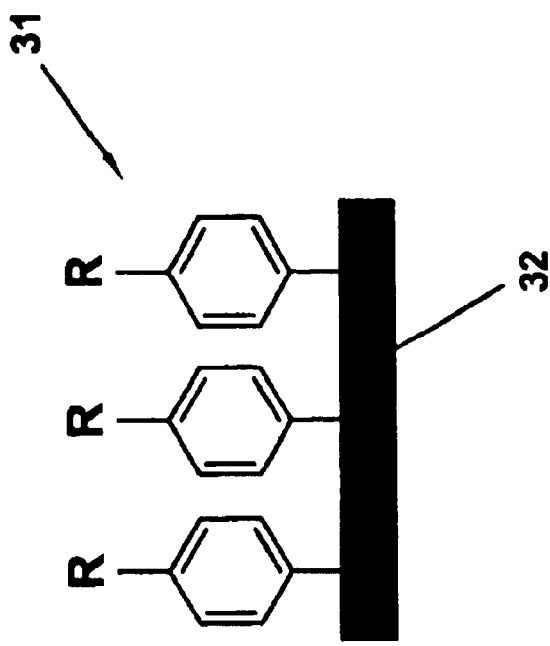

FIGS. 8–10 show a step-wise construction of a monolayer in accordance with one embodiment of the present invention (i.e., showing the chemical monolayer shown in FIG. 1). FIG. 8 shows that a substrate such as glassy carbon or silicon substrate 28. In this case, the width of the substrate 18 is approximately 1 cm while the thickness is approximately 3 mm. The substrate is a polished to a roughness of about 0.05 micrometers.

FIG. 9 shows the substrate 28 is then provided with a positive photoresist 29 (i.e., AZ4330, commercially available from Hoechst Chemicals) to provide a pyrolyzed photoresist film 30.

FIG. 10 shows a chemical method by which molecular units 31 may be attached to the carbon PPF 32. This reaction causes the molecular units 31 to be conjugated to the pi orbital system. Typical coverage is on the order of $6 \times 10^{-10}$ moles per $cm^2$. The molecular units 31 become preferentially oriented perpendicular to the surface of the carbon PPF 32.

Spectroscopic studies have shown that the Raman cross-section of the organic monolayer is about 1000 times that in solution, and an electron tunneling rate through the chemical monolayer is approximately $10^5$ faster than that for an aliphatic (non-conjugated) film.

Figure 11B:
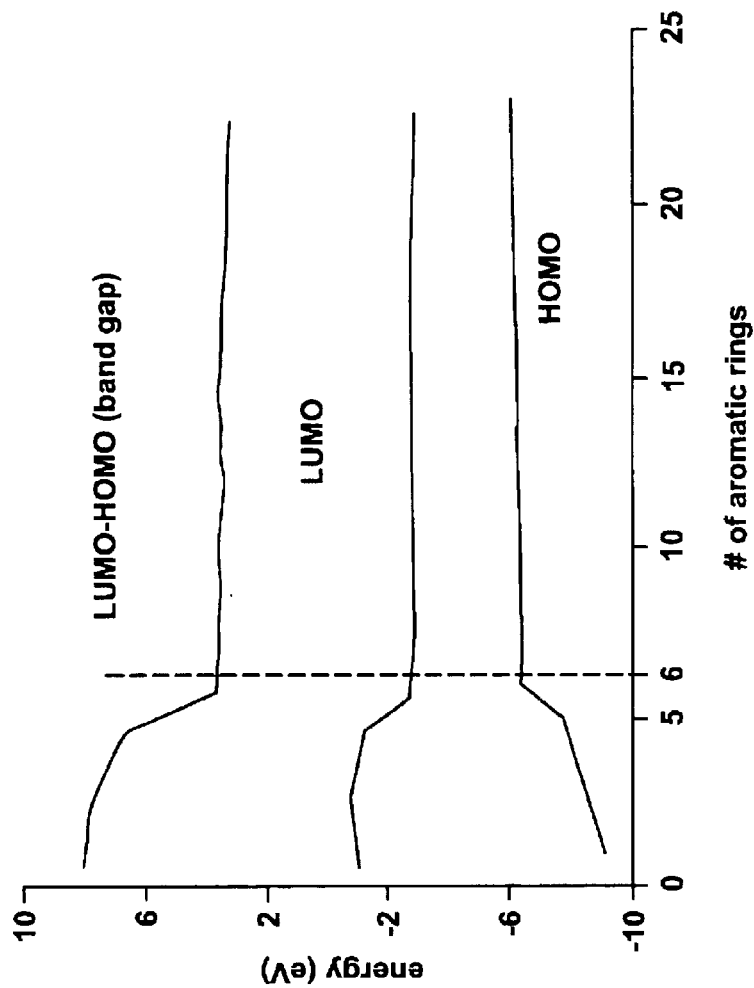
FIGS. 11A and 11B respectively show model compounds of nitroazobenzene bonded to the graphite plane of the carbon PPF, and a graph of energy (eV) vs. the number of aromatic rings, in accordance with one embodiment of the present invention.
Figure 11A:
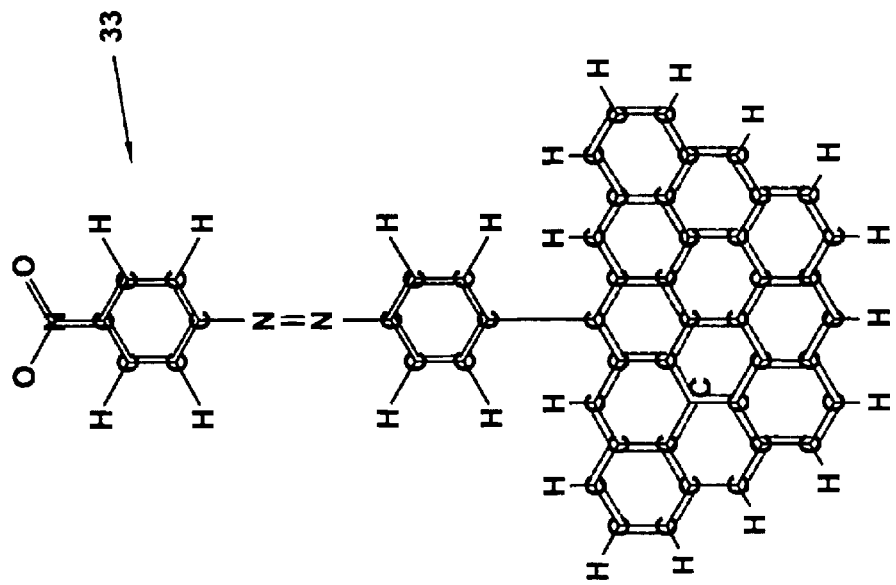

FIG. 11A shows model compounds of nitroazobenzene 33 bonded to the graphite plane of the carbon PPF 34, and FIG. 11B shows a graph of energy (eV) vs. the number of aromatic rings in the $sp^2$ hybridized graphitic moiety. The graph shows that the band gap decreases from about 6 eV to about 3 eV when the graphite plane of the carbon PPF exceeds five rings. The modification of molecular orbital energies by conjugation to substrate permits the production of a molecular (i.e., organic) semiconductor. In this regard, the HOMO/LUMO gap is analogous to the band gap in semiconductors.

The ability to inject electrons into the LUMO allows for the production of devices based upon the ability of the electronic junctions of the present invention to act as a Schmidt trigger memory device. For instance, memory devices such as disk drives, flash memory cards, etc. may be created. These devices would operate by having a portion of the chemical monolayer excited through a relatively high potential to inject electrons into the LUMO where it may remain for a relatively long period of time (i.e., on the order of several minutes or hours). For instance, a disk drive may be created using a chemical monolayer in accordance with the present invention such that a read-write head could provide the required potential to selectively write, read and rewrite to the chemical monolayer segments that may be used as memory sectors. In similar fashion, the chemical monolayer of the present invention may be used as flash memory segments. Because bistable memory switches may be made as small as a few molecules in size, the potential data density may be very high in comparison to known memory devices. In this regard, one of the mechanisms by which a device of this type might operate is through the injections of electrons into the LUMO of the chemical monolayer.

FIGS. 12A–12J present a variety of types of organic molecular units that may be used as components of the chemical monolayer of the present invention (shown here extending from bases representing a substrate layer to which they are chemically bound). These may in turn be chemically bound to a second conductive layer or otherwise placed into electrical contact with a second conductive component as described above (not shown). They may also be used in a multiple-layer device as described above. It will be appreciated accordingly, that the chemical structure may be varied through a very wide range of molecule shape, functionality, band gap, degree of conjugation and size, and that the thickness of the monolayer may be varied as well, depending upon the size and shape of the molecular units.

Figure 13:
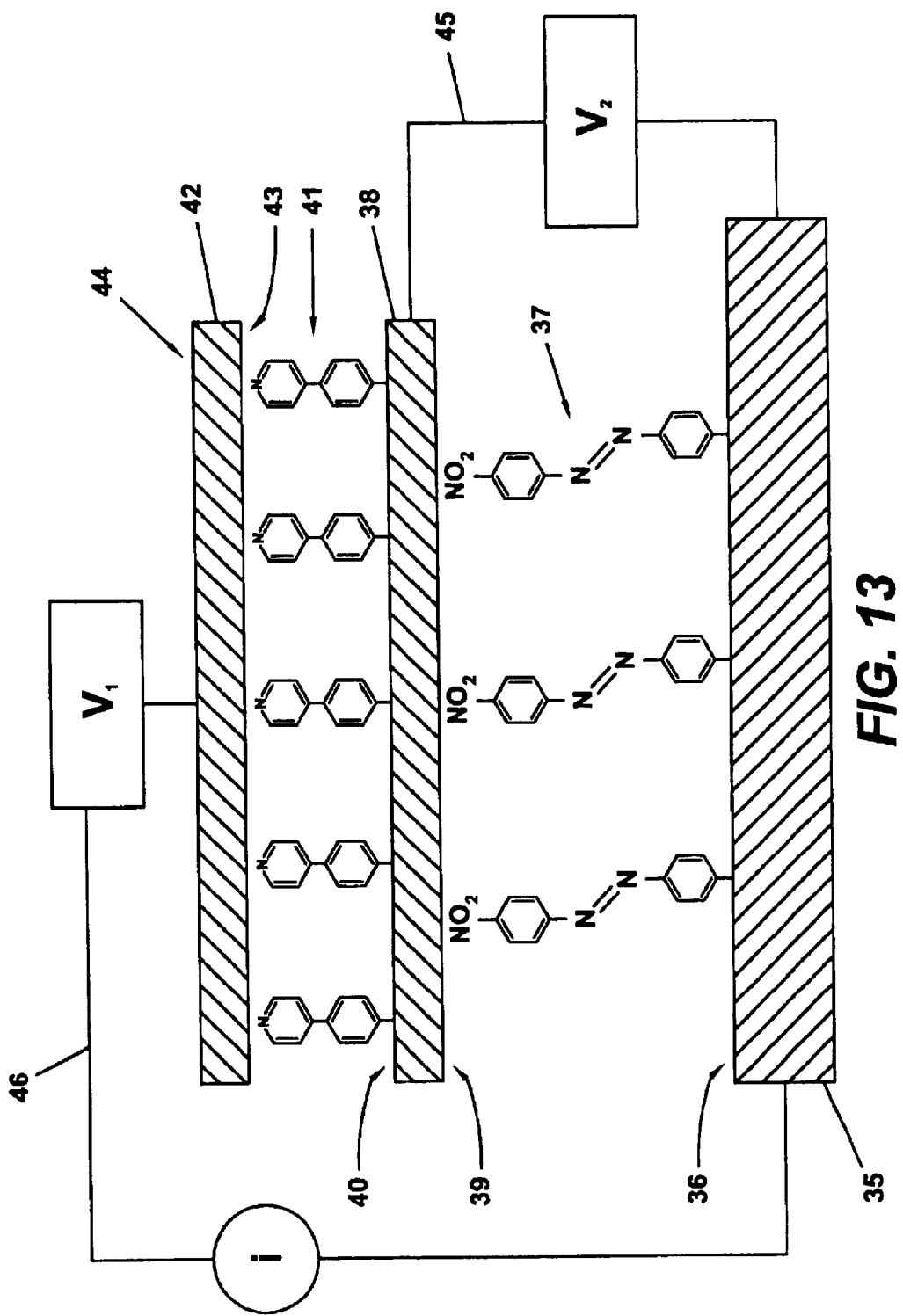
FIG. 13 shows an example of a multi-layer electronic device in accordance with one embodiment of the present invention.

FIG. 13 shows an example of a multi-layer electronic device in accordance with one embodiment of the present invention. FIG. 13 shows first conductive component 35 comprising a first contact surface 36; a monolayer 37 of a first plurality of substantially parallel first molecular units having first and second ends, each of the parallel first molecular units of substantially the same length and attached through its first end to the first contact surface 36 through a conjugated bond; a second conductive component having first and second sides 39 and 40, respectively. The first side 39 in electrical contact with the second ends of the parallel first molecular units, and the second side 40 having a second contact surface; a monolayer 41 of a second plurality of substantially parallel second molecular units having first and second ends, each of the parallel second molecular units attached through their first end to the second contact surface of the second side 40 through a conjugated bond; and a third conductive component 42 having first and second sides 43 and 44, respectively. The first side 43 is in electrical contact with the second ends of the parallel second molecular units. FIG. 13 also shows that the monolayers 37 and 41 may become part of respective electrical circuits 45 and 46. Alternatively, multiple monolayer constructions of the present invention may be linked in a series to achieve accordingly different results in an electronic junction (i.e., taking advantage of the additive effects of each of a series of similar or dissimilar chemical monolayers).

Figure 14:
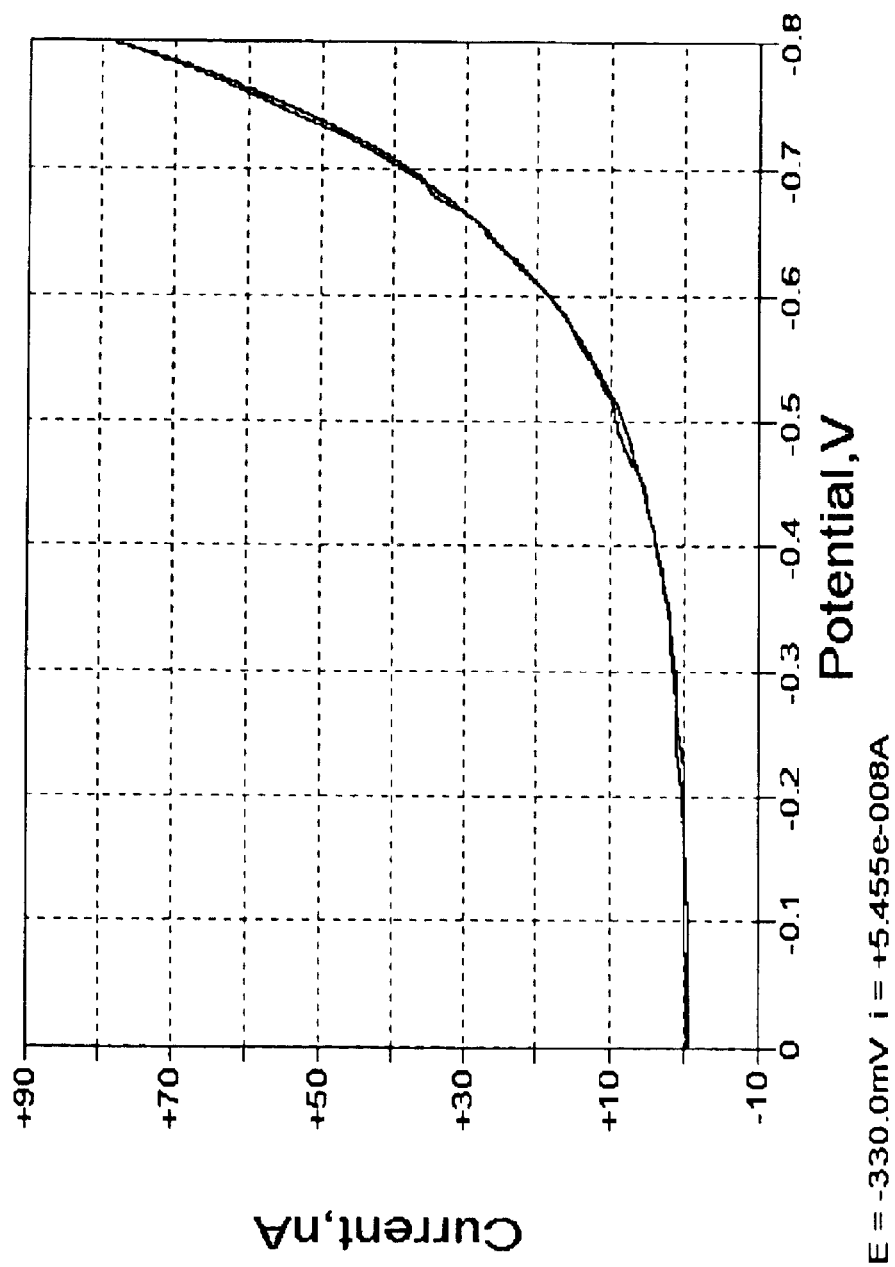
FIGS. 14 and 15 show graphs of the current/voltage characteristics taken from experiments conducted on a monolayer described in FIGS. 1 and 1A.
Figure 15:
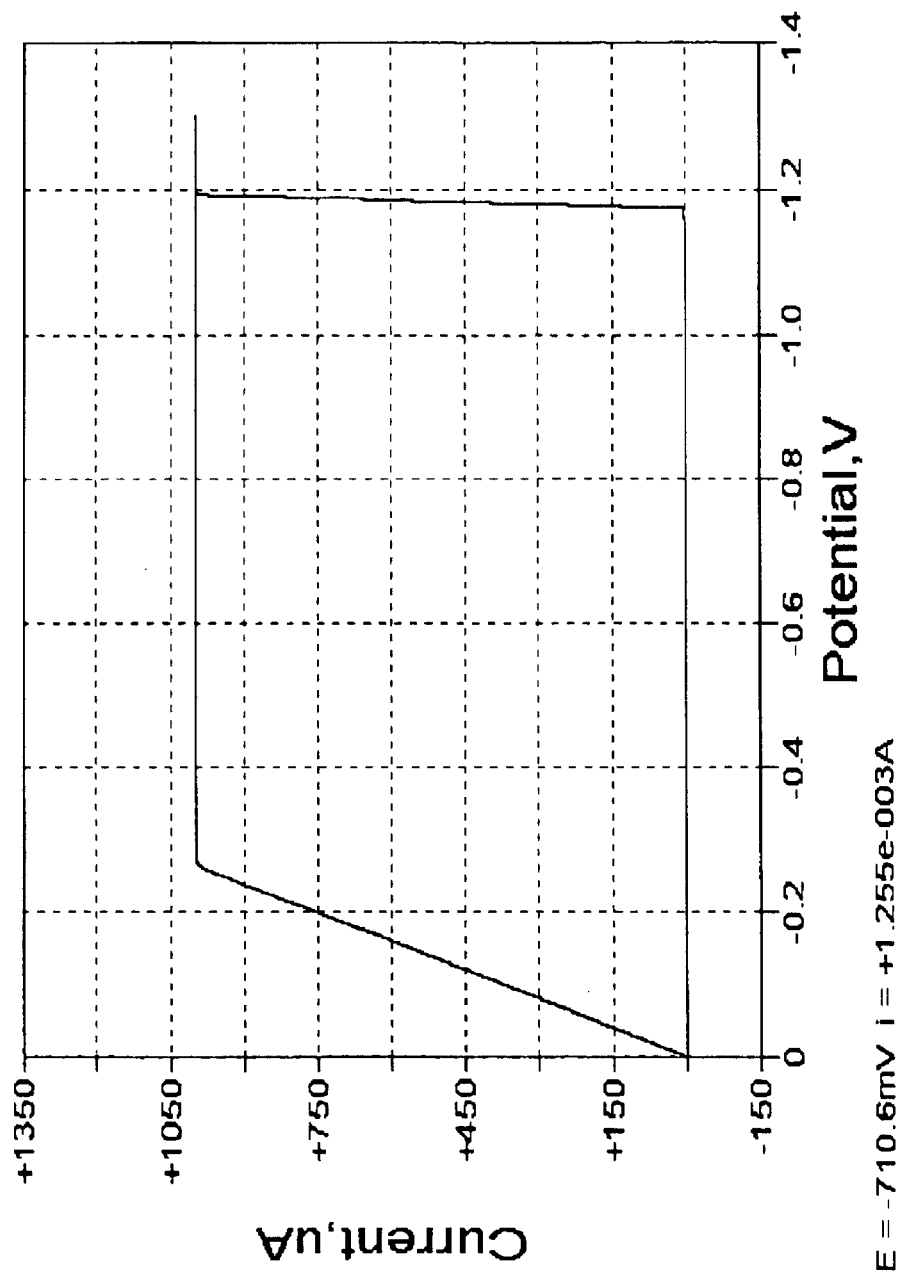

FIGS. 14 and 15 show graphs of the current/voltage characteristics taken from experiments conducted on a monolayer described in FIGS. 1 and 1A. FIG. 14 demonstrates an exponential dependence of current on applied voltage, which is observed at low applied voltage (below about 1 volt). FIG. 15 shows an example of "breakdown", in which the current suddenly increases at sufficiently high voltage (~1.2 volts in this case).

Figure 16:
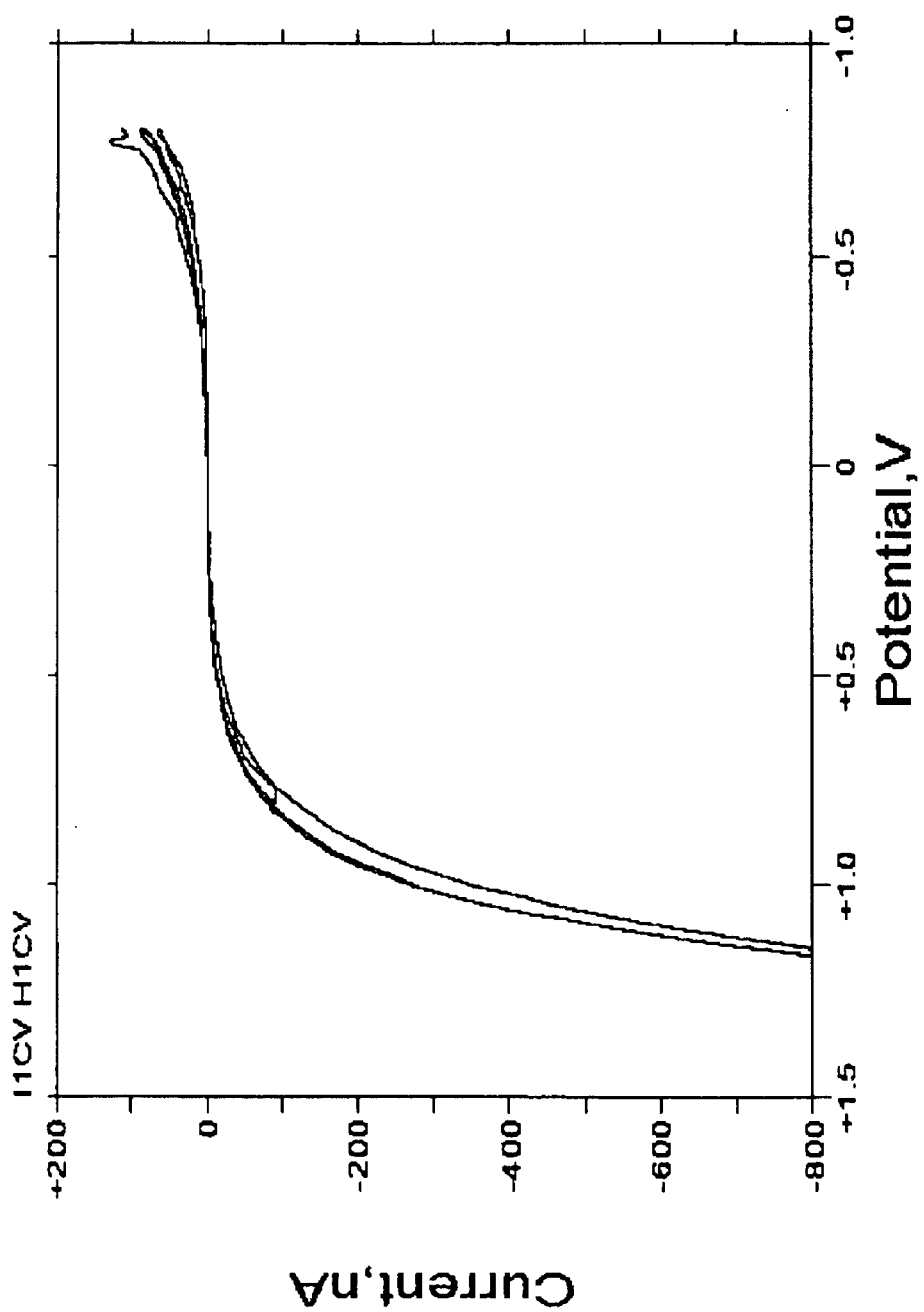
FIG. 16 shows a graph of a current/voltage plot taken from experiments conducted on a monolayer described in FIGS. 1 and 1A.
Figure 17:
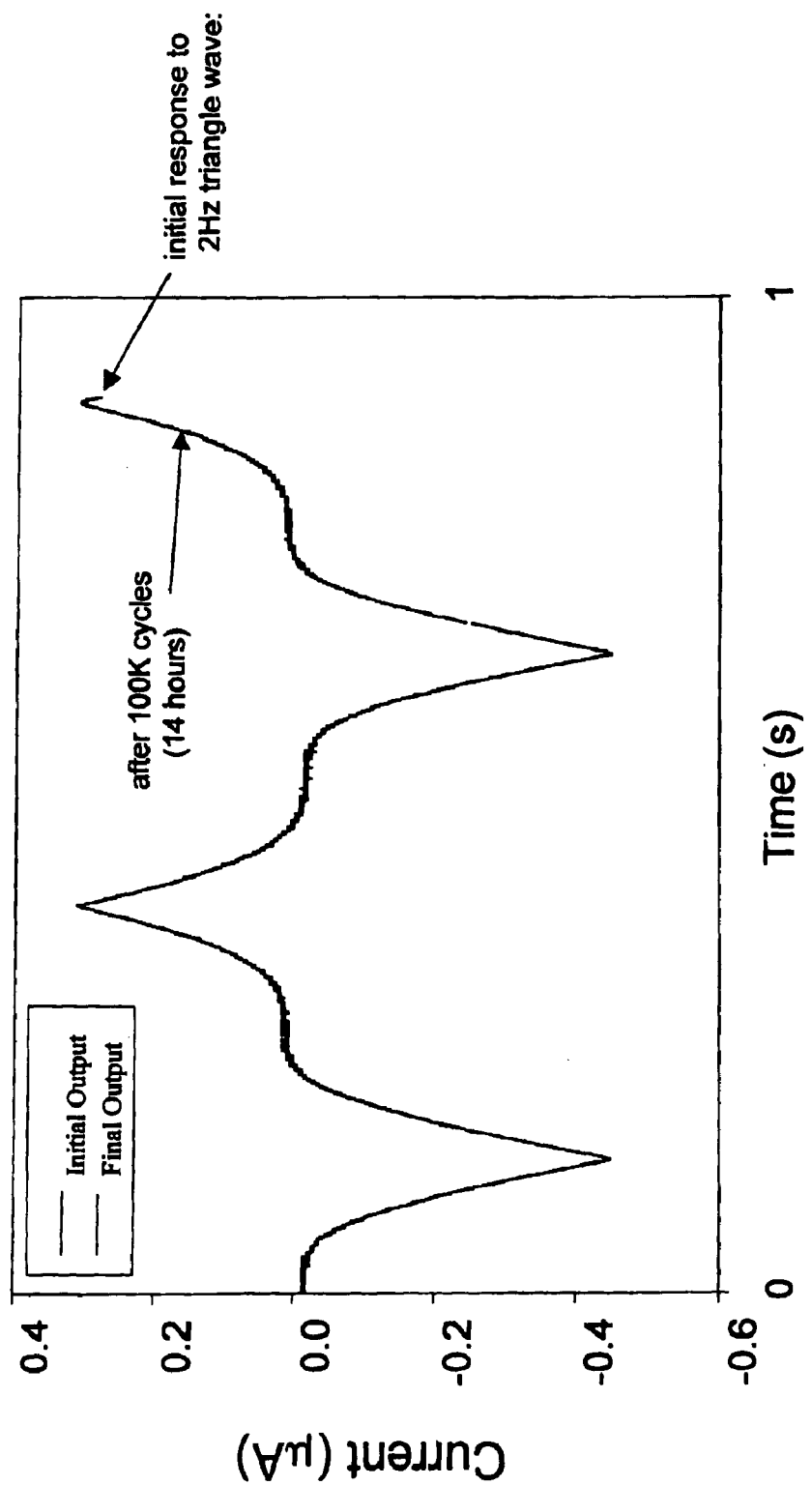
FIG. 17 shows a graph of the current/time characteristics taken from experiments conducted on a monolayer described in FIGS. 1 and 1A.

FIG. 16 shows a graph of the current/voltage characteristics taken from experiments conducted on a monolayer described in FIGS. 1 and 1A when breakdown is avoided. FIG. 16 shows a bipolar current/voltage curve showing the decrease in apparent resistance at both positive and negative potentials. FIG. 17 shows a graph of a current/time plot taken from experiments conducted on a monolayer described in FIGS. 1 and 1A. FIG. 17 demonstrates the long-term stability of a molecular junction during cycling between +1.5 and −1.5 volts. Only minor changes in current voltage behavior occurred over 100,000 cycles during 14 hours.

Figure 18:
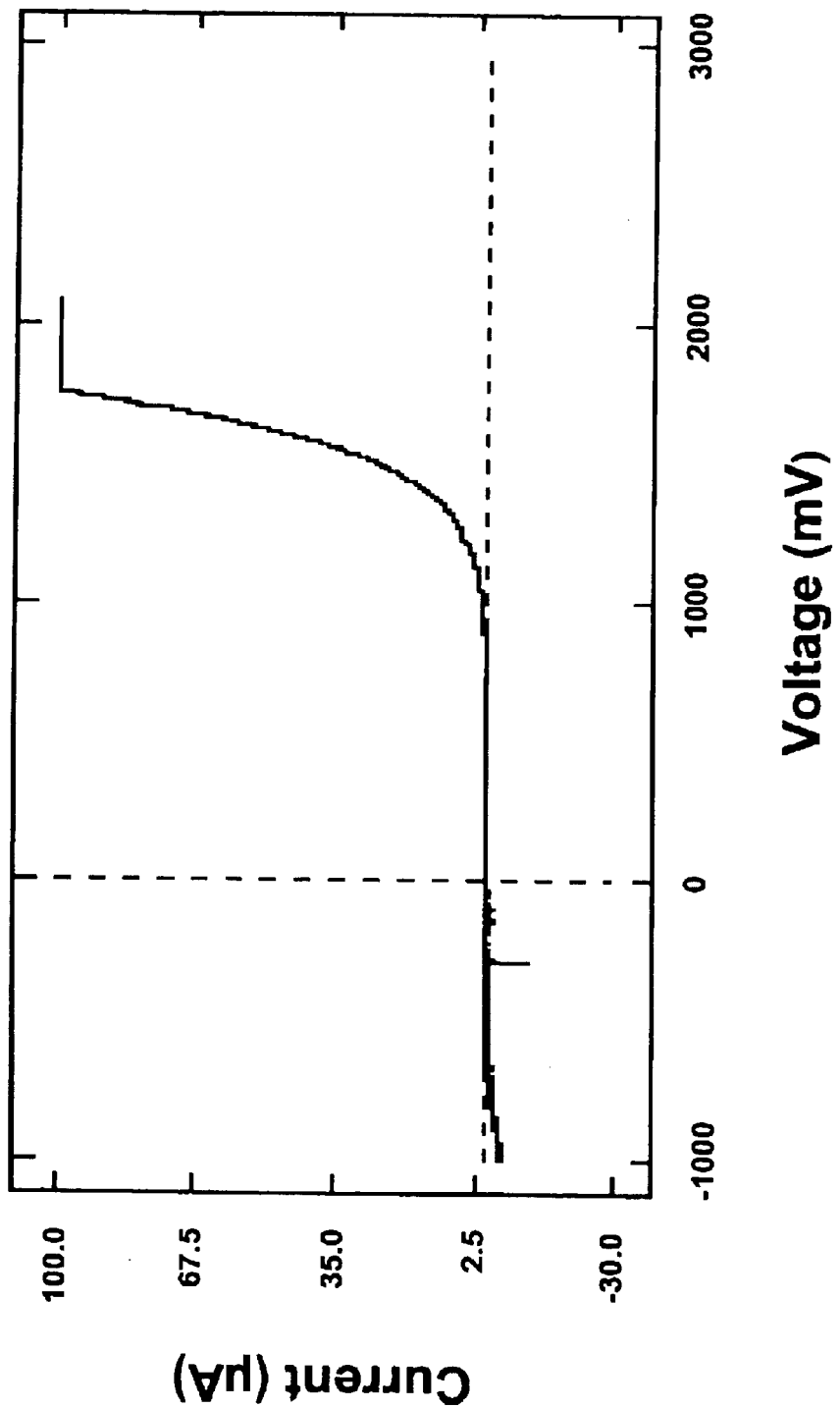
FIG. 18 shows a graph of the current/voltage characteristics taken from experiments conducted on a monolayer described in FIGS. 1 and 1A.
Figure 19:
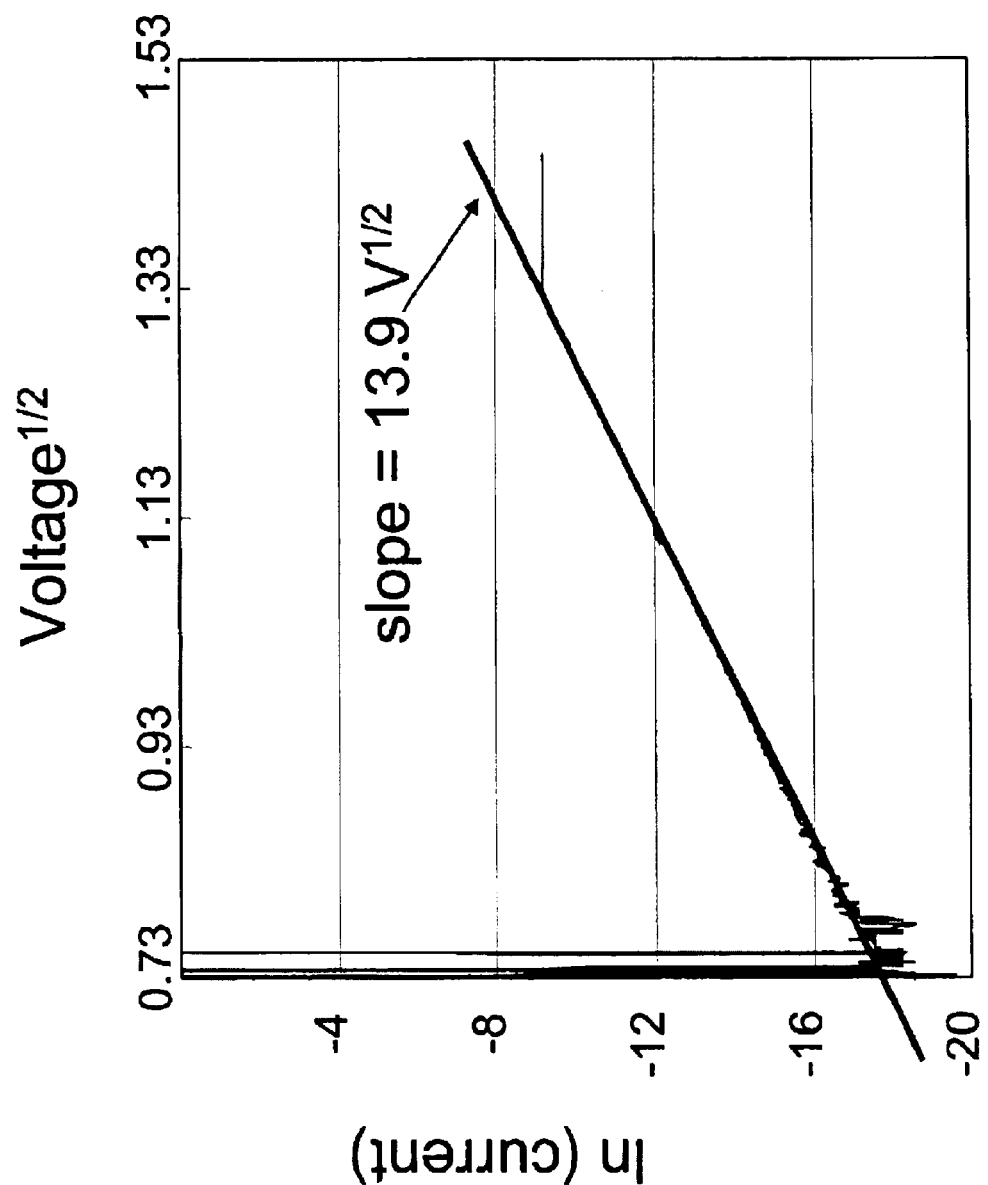
FIG. 19 shows a graph of the natural log of current vs. $V^{1/2}$ taken from experiments conducted on a monolayer described in FIGS. 1 and 1A.

FIG. 18 shows a graph of the current/voltage characteristics taken from experiments conducted on a monolayer described in FIGS. 1 and 1A. FIG. 19 shows a graph of the natural log of current vs. $V^{1/2}$ taken from experiments conducted on a monolayer described in FIGS. 1 and 1A. FIG. 18 is the basis of FIG. 19, which is a plot of the natural logarithm of the current vs. the square root of the voltage. The linearity demonstrated in FIG. 19 is a strong indication that Schottky emission is the dominant mechanism of electron transport through the monolayer film.

Figure 20:
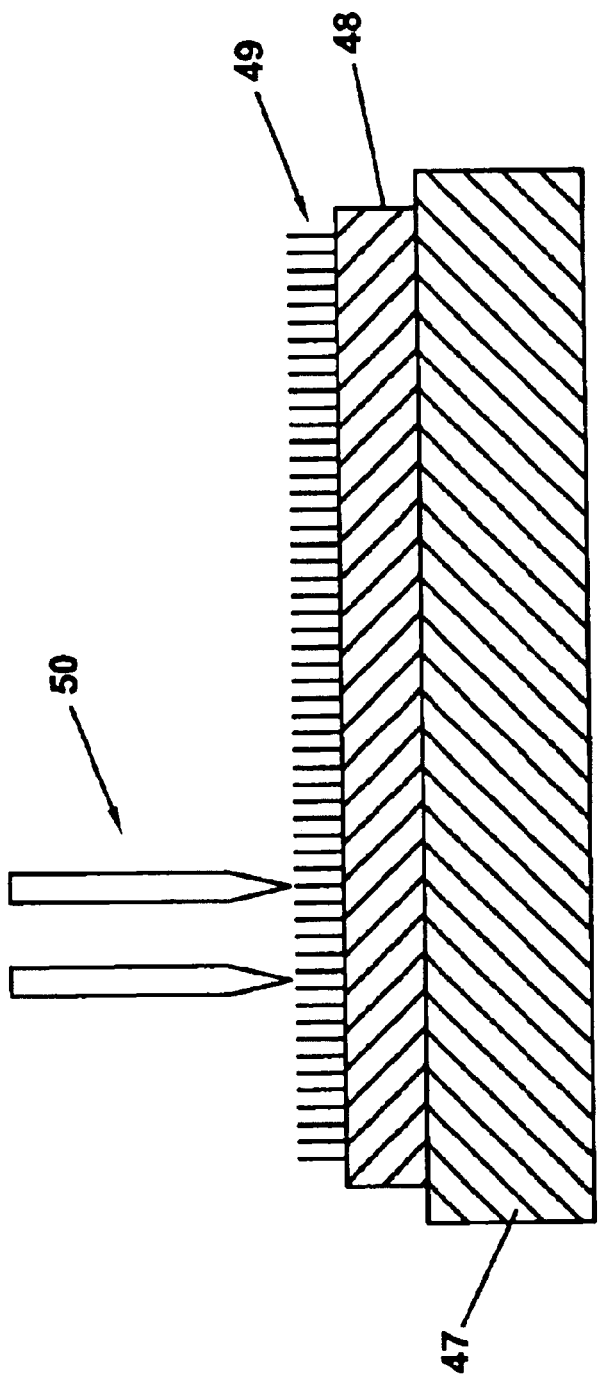
FIG. 20 shows a schematic of a memory device in accordance with one embodiment of the present invention.

FIG. 20 shows a schematic of a memory device in accordance with one embodiment of the present invention. FIG. 20 shows memory device comprising a rigid support 47 (e.g., a rotating disk); a substrate (i.e., deposited PPF substrate 48) disposed on the rigid support and having a contact surface; and a monolayer 49 of a plurality of substantially parallel molecular units having first and second ends, and attached through their first ends to the contact surface through a conjugated bond, and the second ends defining a scan surface. The molecular units are adapted to be changed between a first memory state and a second memory state. At least one read-write device 50 is/are adapted to move along the scan surface of the monolayer and adapted to stimulate a change of the molecular units between the first and second memory states, and to determine the memory state status of regions on the scan surface.

Figure 21:
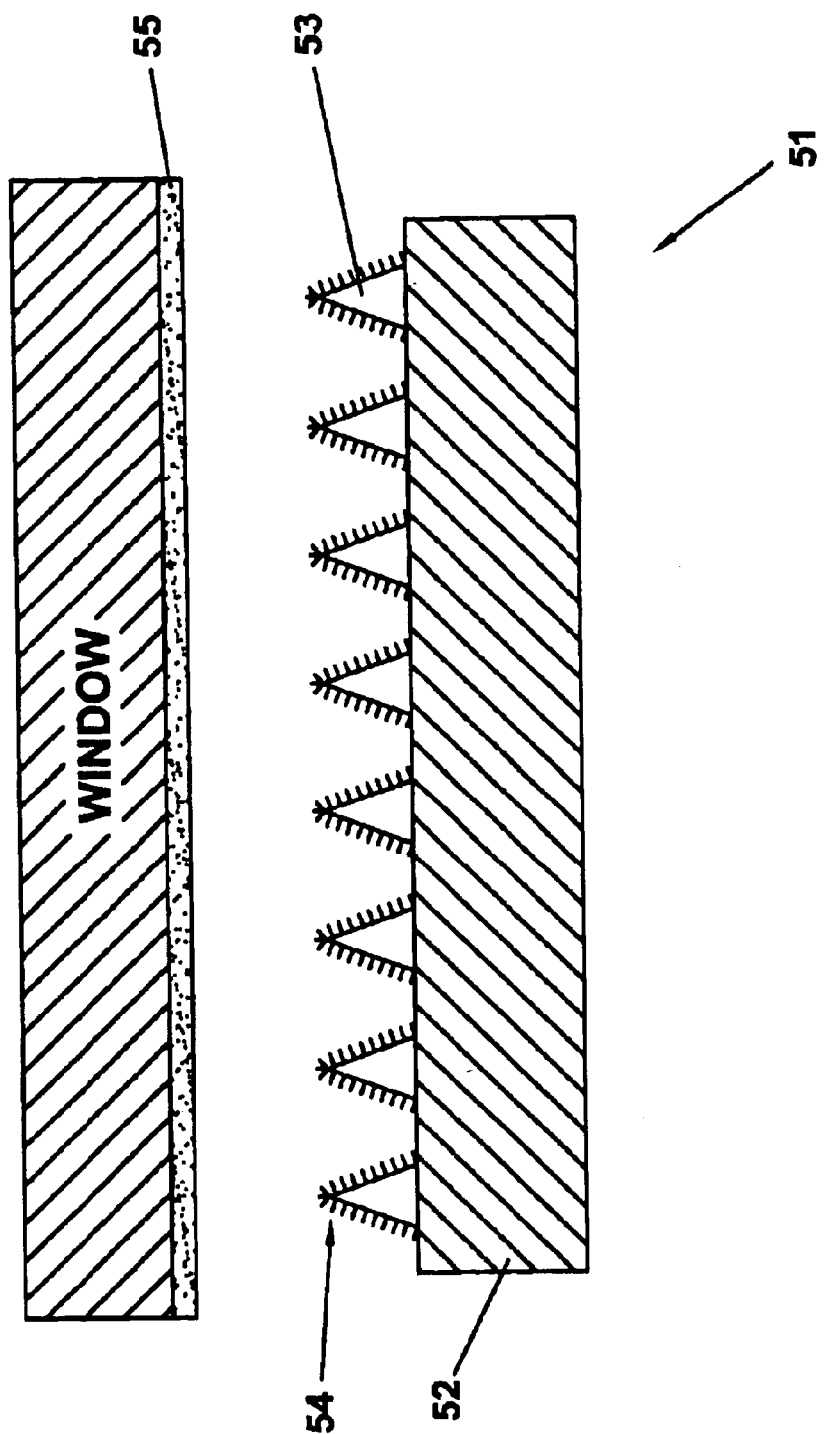
FIG. 21 shows a schematic of a field emitter device in accordance with one embodiment of the present invention.

FIG. 21 shows a schematic of a field emitter device in accordance with one embodiment of the present invention. FIG. 21 shows field emitter device 51 comprising a planar rigid support 52; a substrate disposed on the rigid support and having a contact surface and defining a plurality of extensions 53 extending from the rigid support; and a monolayer 54 of plurality of substantially parallel molecular units having first and second ends, and attached through their first ends to the contact surface through a conjugated bond, and the second ends defining an emission surface, the molecular units adapted to emit electrons in response to an applied potential. The device also includes a source of an applied potential adapted to stimulate the molecular units to emit electrons, and a planar emitter material 55 (e.g., a fluorophore) disposed facing the plurality of extensions and comprising a material adapted to emit light upon stimulation by incident electrons.

The present invention also includes methods of making chemical monolayers and electronic junctions.

The method of producing a chemical monolayer construction comprises providing a substrate (preferably conductive carbon) having a contact surface; and reacting a chemical precursor bearing molecular units with the substrate so as to form a monolayer of a plurality of substantially parallel molecular units attached to the contact surface of the substrate, wherein the molecular units are attached to the substrate so as to be strongly coupled electronically to the substrate and wherein the molecular units have an average length, the contact surface of the substrate has a roughness value that is substantially less than or equal to the average length of the molecular units. It is preferred that the molecular units become attached to the substrate through a conjugated bond.

The method of constructing an electronic junction comprises (a) providing a first conductive component, the first conductive component comprising: (i) a substrate having a contact surface; and (ii) a monolayer of plurality of substantially parallel molecular units having first and second ends, and attached through their first ends to the contact surface through a conjugated bond; and (b) placing a second conductive component in electrical contact with the second ends of the substantially parallel molecular units. It is preferred that the second conductive component is chemically bound to the second ends of the substantially parallel molecular units. It is also preferred that the second conductive component is covalently bound to the second ends of the substantially parallel molecular units.

INDUSTRIAL APPLICABILITY

The present invention may be used in the following industrial and commercial applications:

1. Microelectronics

The existing microelectronics industry is based on semiconductors, such as silicon and metal oxides, fabricated into a variety of junctions between semiconductors to make P/N junctions, diodes, transistors, etc. The monolayer junction disclosed herein may have quite different and more versatile properties than conventional semiconductor junctions. Since the molecular orbitals of the monolayer can be varied by alterations in chemical structure, a wide variety of transfer functions is possible. PPF or similar smooth substrates may be fabricated in complex patterns via photolithography, so it may be possible to combine monolayer junctions with conventional semiconductor microcircuits. Possible new microdevices based on monolayer junctions include capacitors, multistate storage elements, and optically sensitive switches. It is possible that molecular electronic junctions may consume much less power than conventional electronic circuits, increasing portability and decreasing heat output.

2. Photodetectors and Imaging Devices.

The monolayer may be made photosensitive, by choosing a molecule with a HOMO/LUMO gap corresponding to the desired photon energy. A thin metallic layer would be partially transparent, and photon arrival at the monolayer would trigger a conductivity increase, similar to a photodiode. Since the HOMO/LUMO gap is variable, the device could be made to be wavelength specific. An array of such junctions could serve as an image collector, with color resolution made possible by the creation of multi-color-capable pixels. In addition, photodetectors might be combined with fiber optic and photonic circuits to yield a fast optical/electrical transducer.

3. Chemical Sensors

The molecular orbitals of the monolayer molecule may be sensitive to the chemical environment. For example, a bipyridyl spacer (FIG. 7) interacts with metal ions, and might yield a change in conductivity. A pattern of junctions would be required, since access to the monolayer is at its edge. Analysis of gases, liquids and solutions is amenable to this approach, with possible applications in clinical analysis, environmental monitoring, and process analytical chemistry.

4. Light Emission

By analogy to light emitting diodes, a potential across the proposed monolayer junction should inject elections into a high-energy orbital of the monolayer. The electron may then make a transition to a lower energy orbital, emitting light. Arrays of such devices could be used in flat-panel displays or surface emitting diode arrays, with color controlled by the energy levels of the monolayer. Extension of light emission to amplification and lasing are conceivable.

5. Voltage Modulation of Reflectivity

For a thin metallic overcoat, the optical properties of the metal surface may depend on both the identities of the monolayer and the applied potential. The reflectivity vs. wavelength curve of the metal may be voltage dependent, and possibly modulatable on a rapid time scale. Color video projection and panel displays using natural or artificial white light are also possible.

Other applications of the monolayer junction to the microelectronics, photonics, and display industries, may become apparent to one skilled in these arts. The versatility inherent in a device, which exploits a molecule as a circuit element, may be as important an advance as the semiconductor junctions that spawned all of modern electronics.

References:
1. C. A. Mirkin, M. A. Ratner, "Molecular Electronics", Annu. Rev. Phys. Chem., 1992, 43, 719–754.
2. M. A. Reed, J. M. Tour, "Computing with Molecules", Scientific American, 2000, 86–93
3. L. A. Bumm, J. J. Arnold, M. T. Cygan, T. D. Dunbar, T. P. Burgin, L. Jones, D. L. Allara, J. M. Tour, P. S. Weiss, "Are single Molecular Wires Conducting?", Science, 1996, 271, 1705
4. C. Zhou, M. R. Deshpande, M. A. Reed, L. Jones, J. M. Tour, "Nanoscale Metal/Self-Assembled Monolayer/Metal Heterostructures" Appl. Phys. Lett., 1997, 71(5), 661.
5. M. A. Reed, C. Zhou, C. J. Muller, T. P. Burgin, J. M. Tour, "Conductance of a Molecular Junction". Science, 1997, 278, 252.
6. L. A. Bumm, J. J. Arnold, T. D. Dunbar, D. L. Allara, P. S. Weiss, "Electron Transfer through Organic Molecules", J. Phys. Chem. B., 1999, 103, 8122–8127.
7. C. P. Collier, E. W. Wong, M. Belohradsky, F. M. Raymo, J. F. Stoddart, P. J. Kuekes, R. S. Williams, J. R. Heath, "Electronically Configurable Molecular-Based Logic Gates", Science, 1999, 285, 391–393
8. C. P. Collier, G. Mattersteig, E. W. Wong, Y. Luo, K. Beverly, J. Sampaio, F. M. Raymo, J. F. Stoddart, J. R. Heath, "A [2]Catenane-Based Solid State Electronically Reconfigurable Switch", Science, 2000, 289, 1172–1175.
9. J. Pinson, J. Saveant, R. Hitmi, "Process for Modifying the Surface of Carbon-Containing Materials by Electro-Chemical Reduction of Diazonium Salts, Applicable in Particular to Carbon Fibers For Composite Materials: Carbon-Containing Materials So Modified", French Patent, PCT/FR92/0087, 1992.
10. P. Allongue, M. Delamar, B. Desbat, O. Fagebaume, R. Hitmi, J. Pinson, J. M. Saveant, "Covalent Modification of Carbon Surfaces by Aryl Radicals Generated from the Electrochemical Reduction of Diazonium Salts", J. Am. Chem. Soc., 1997, 119, 201–207
11. Y-C. Liu, R. L. McCreery, "Reactions of Organic Monolayers on Carbon Surfaces Observed with Unenhanced Raman Spectroscopy", J. Am. Chem. Soc., 1995, 117, 11254.
12. S. Ranganathan, R. McCreery, S. M. Majji, M. Madou, "Photoresist-Derived Carbon for Microelectrochemical Applications", *J. Electrochem. Soc.*, 2000. 147, 277–282.

The foregoing references are hereby incorporated herein by reference.

The preferred embodiments herein disclosed are not intended to be exhaustive or to unnecessarily limit the scope of the invention. The preferred embodiments were chosen and described in order to explain the principles of the present invention so that others skilled in the art may practice the invention. Having shown and described preferred embodiments of the present invention, it will be within the ability of one of ordinary skill in the art to make alterations or modifications to the present invention, such as through the substitution of equivalent materials or structural arrangements, or through the use of equivalent process steps, so as to be able to practice the present invention without departing from its spirit as reflected in the appended claims, the text and teaching of which are hereby incorporated by reference herein. It is the intention, therefore, to limit the invention only as indicated by the scope of the claims and equivalents thereof.

What is claimed is:

1. A pixel array comprising a plurality of pixels, each pixel comprising:
    a first conductive component, said first conductive component comprising:
        a substrate having a contact surface; and
        a monolayer of a plurality of substantially parallel molecular units having first and second ends, and attached through its first end to said contact surface through a conjugated bond; and
    a second conductive component in electrical contact with said second ends of said substantially parallel molecular units, wherein at least some of said molecular units form a molecular orbital such that incident electromagnetic radiation may alter the electronic character of said at least some of said molecular units.

2. A pixel array according to claim 1 wherein at least one of said first and second conductive components is translucent.

3. A pixel array comprising a plurality of pixels, each pixel comprising:
    a first conductive component, said first conductive component comprising:
        a substrate having a contact surface; and
        a monolayer of a plurality of substantially parallel molecular units having first and second ends, and attached through its first end to said contact surface through a conjugated bond; and
    a second conductive component in electrical contact with said second ends of said substantially parallel molecular units, wherein at least some of said molecular units form a molecular orbital such that the passage of current through said at least some of said molecular units causes the emission of electromagnetic radiation from said at least some of said molecular units.

4. A pixel array according to claim 3 wherein at least one of said first and second conductive components is translucent.

* * * * *

UNITED STATES PATENT AND TRADEMARK OFFICE
CERTIFICATE OF CORRECTION

PATENT NO.    : 6,919,128 B2
DATED         : July 19, 2005
INVENTOR(S)   : McCreery It is certified that error appears in the above-identified patent and that said Letters Patent is hereby corrected as shown below:

Title page,
Item [56], References Cited, OTHER PUBLICATIONS, please delete "C.P. Collier, G. Mattersteig, E.W. Wong, Y. Luo, K. Beverly, J. Sampaio, F.M. Raymo, J.F. Stoddart, J.R. Heath, "A[2] Catenane-Based Solid State Electronically Reconfigurable Switch", Science, 2000, 289, 1172 - 1175." and insert
-- C.P. Collier, G. Mattersteig, E.W. Wong, Y. Luo, K. Beverly, J. Sampaio, F.M. Raymo, J.F. Stoddart, J.R. Heath, "A [2]Catenane-Based Solid State Electronically Reconfigurable Switch", Science, 2000, 289, 1172 - 1175. --;
please add -- J. Pinson, J. Saveant, R. Hitmi, "Process for Modifying the Surface of Carbon-Containing Materials by Electro-Chemical Reduction of Diazonium Salts, Applicable in Particular to Carbon Fibers For Composite Materials: Carbon-Containing Materials So Modified", French Patent, PCT/FR92/0087, 1992. --; and please delete "M.D. Musick, C.D. Keating, L.A. Lyon, S.L. Botsko, D.J. Pena, W.D. Holliway, T.M. McEvoy, J.N. Richardson, M.J. Natan, "Metal Films Prepared by Stepwise Assembly, 2 Construction and Characterization of Colloidal Au and Ag Multilayers", Chem. Mater., WEB 2000." and insert -- M.D. Musick, C.D. Keating, L.A. Lyon, S.L. Botsko, D.J. Pena, W.D. Holliway, T.M. McEvoy, J.N. Richardson, M.J. Natan, "Metal Films Prepared by Stepwise Assembly. 2 Construction and Characterization of Colloidal Au and Ag Multilayers", Chem. Mater., WEB 2000. --.

Column 17,
Lines 20-22, please delete "5. M. A. Reed, C. Zhou, C. J. Muller, T. P. Burgin, J. M. Tour, "Conductance of a Molecular Junction". Science, 1997, 278, 252." and insert -- 5. M.A. Reed, C. Zhou, C.J. Muller, T.P. Burgin, J.M. Tour, "Conductance of a Molecular Junction", Science, 1997, 278, 252. --.

Signed and Sealed this

Eleventh Day of October, 2005

JON W. DUDAS
*Director of the United States Patent and Trademark Office*

UNITED STATES PATENT AND TRADEMARK OFFICE
CERTIFICATE OF CORRECTION

PATENT NO. : 6,919,128 B2  Page 1 of 1
APPLICATION NO. : 10/754257
DATED : July 19, 2005
INVENTOR(S) : McCreery It is certified that error appears in the above-identified patent and that said Letters Patent is hereby corrected as shown below:

In column 10, line 26, please delete "FIG. 1" and insert -- FIG. 1A --.

In column 10, line 41, please delete "FIGS. 1 and 1A" and insert -- FIGS. 1A and 1B --.

In column 10, line 44, please delete "FIGS. 1 and 1A" and insert -- FIGS. 1A and 1B --.

In column 10, line 48, please delete "FIGS. 1 and 1A" and insert -- FIGS. 1A and 1B --.

In column 10, line 51, please delete "FIGS. 1 and 1A" and insert -- FIGS. 1A and 1B --.

In column 10, line 54, please delete "FIGS. 1 and 1A" and insert -- FIGS. 1A and 1B --.

In column 10, line 57, please delete "FIGS. 1 and 1A" and insert -- FIGS. 1A and 1B --.

In column 13, line 18, please delete "FIG. 1" and insert --FIG. 1A --.

In column 14, line 50, please delete "FIGS. 1 and 1A" and insert -- FIGS. 1A and 1B --.

In column 14, line 58, please delete "FIGS. 1 and 1A" and insert -- FIGS. 1A and 1B --.

In column 14, line 63, please delete "FIGS. 1 and 1A" and insert -- FIGS. 1A and 1B --.

In column 15, line 3, please delete "FIGS. 1 and 1A" and insert -- FIGS. 1A and 1B --.

In column 15, line 5, please delete "FIGS. 1 and 1A" and insert -- FIGS. 1A and 1B --.

Signed and Sealed this

Fifteenth Day of August, 2006

JON W. DUDAS
*Director of the United States Patent and Trademark Office*